(12) United States Patent
Hirokubo

(10) Patent No.: US 10,712,200 B2
(45) Date of Patent: Jul. 14, 2020

(54) SPECTROSCOPIC APPARATUS, TEMPERATURE CHARACTERISTIC DERIVATION APPARATUS, SPECTROSCOPIC SYSTEM, SPECTROSCOPY METHOD, AND TEMPERATURE CHARACTERISTIC DERIVATION METHOD

(71) Applicant: Seiko Epson Corporation, Tokyo (JP)

(72) Inventor: Nozomu Hirokubo, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/284,227

(22) Filed: Feb. 25, 2019

(65) Prior Publication Data

US 2019/0265103 A1 Aug. 29, 2019

(30) Foreign Application Priority Data

Feb. 26, 2018 (JP) .................................. 2018-032152

(51) Int. Cl.
*G01J 3/26* (2006.01)
*G01R 27/26* (2006.01)
(Continued)

(52) U.S. Cl.
CPC .... *G01J 3/26* (2013.01); *G01J 3/28* (2013.01); *G01R 27/2605* (2013.01); *G02B 26/001* (2013.01); *G01J 2003/1226* (2013.01)

(58) Field of Classification Search
CPC ........ G01J 3/00; G01J 3/02; G01J 3/26; G01J 3/28; G01J 2003/1226; G02B 26/001
See application file for complete search history.

(56) References Cited

U.S. PATENT DOCUMENTS 6,504,616 B1 1/2003 Haber et al.
2006/0001881 A1 1/2006 Maier et al.
(Continued)

FOREIGN PATENT DOCUMENTS

JP 01-094312 A 4/1989
JP 2004-228368 A 8/2004
(Continued)

OTHER PUBLICATIONS

Extended European Search Report for Application No. EP 19 15 9083 dated Nov. 18, 2019 (12 pages).
(Continued)

*Primary Examiner* — Jonathan M Hansen
(74) *Attorney, Agent, or Firm* — Harness, Dickey & Pierce, P.L.C.

(57) ABSTRACT

A spectroscopic apparatus includes: a spectroscopic module; a temperature detector that detects a temperature of the spectroscopic module; and a module controller that controls the spectroscopic module, in which the spectroscopic module includes an interference filter that has a gap changing unit which changes a dimension of a gap between a pair of reflection films, and a capacity detection circuit that outputs a detection signal in accordance with an electrostatic capacity between the pair of reflection films, and in which the module controller corrects a target value of the detection signal that is output from the capacity detection circuit, based on a temperature characteristic of the spectroscopic module and a detection temperature that is detected by the temperature detector, and controls the voltage that is to be applied to the gap changing unit, that the detection signal that is output from the capacity detection circuit is the corrected target value.

20 Claims, 14 Drawing Sheets

(51) Int. Cl.
    *G02B 26/00*    (2006.01)
    *G01J 3/28*     (2006.01)
    *G01J 3/12*     (2006.01)

(56) References Cited

U.S. PATENT DOCUMENTS

| | | | |
|---|---|---|---|
| 2010/0292581 A1 | 11/2010 | Howard et al. | |
| 2013/0083399 A1* | 4/2013 | Hirokubo | G01J 3/26 359/578 |
| 2013/0308134 A1 | 11/2013 | Hirokubo | |
| 2014/0240508 A1* | 8/2014 | Gomi | G01J 3/2823 348/162 |
| 2015/0211922 A1* | 7/2015 | Yu | G01J 3/28 356/326 |
| 2015/0212313 A1 | 7/2015 | Hirokubo | |
| 2017/0146401 A1 | 5/2017 | Antila | |

FOREIGN PATENT DOCUMENTS

| | | |
|---|---|---|
| JP | 2005-030890 A | 2/2005 |
| JP | 2013-238755 A | 11/2013 |
| JP | 2015-141210 A | 8/2015 |

OTHER PUBLICATIONS

Partial European Search Report for Application No. EP 19 15 9083 dated Aug. 2, 2019 (15 pages).

* cited by examiner

SPECTROSCOPIC APPARATUS, TEMPERATURE CHARACTERISTIC DERIVATION APPARATUS, SPECTROSCOPIC SYSTEM, SPECTROSCOPY METHOD, AND TEMPERATURE CHARACTERISTIC DERIVATION METHOD

BACKGROUND

1. Technical Field

The present invention relates to a spectroscopic apparatus, a temperature characteristic derivation apparatus, a spectroscopic system, a spectroscopy method, and a temperature characteristic derivation method.

2. Related Art

In the related art, a spectroscopic apparatus is known that includes a pair of reflection films and an interference filter (for example, refer to JP-A-1-94312).

In a spectroscopic apparatus (a variable interference apparatus) that is disclosed in JP-A-1-94312, an electrostatic capacity between reflection films of an interference filter (a Fabry-Perot interference unit) is measured with a capacity detection circuit (an electrostatic capacity detection circuit), and is feedback-controlled in such a manner that a dimension of a gap between the reflection films is a desired target value.

In some cases, in the spectroscopic apparatus as disclosed in JP-A-1-94312, a temperature of an interference filter or a capacity detection circuit changes according to an operating environment.

Normally, the interference filter is fixed to a fixation target on a packaging or a substrate that accommodates an interference filter, with a fixation member such as an adhesive agent in between. For this reason, when an ambient temperature of the interference filter changes, stress in accordance with a difference in a linear expansion coefficient among the interference filter, the fixation member, and the fixation target, builds up in the interference filter. With this stress, bending or inclining of a reflection film takes place in some cases, a dimension of a gap between the reflection films changes, and a wavelength of a light that passes through the interference filter is also shifted.

At this point, a wavelength of a light that the interference filter transmits is in proportion to the dimension of the gap between the reflection films. Consequently, in a case where the dimensions of the gap between the reflection films changes due to a temperature change, the dimension of the gap between the reflection films may be controlled in such a manner that an average value of the dimension of the gap between the reflection films may be a dimension in accordance with a target wavelength of the transmitted light.

However, an electrostatic capacity between the reflection films of the interference filter is in inverse proportion to the dimension of the gap between the reflection films. In this case, it does not mean that an average of signal values that are output from the capacity detection circuit is an average of dimensions of the gaps between the reflection films. In addition to this, although a temperature characteristic is present in the capacity detection circuit itself and the dimension of the gap between the reflection films is the same dimension, if a temperature varies, a different value is detected.

Therefore, in a case where, as in a spectroscopic measurement apparatus in JP-A-1-94312, feedback control that calibrates the dimension of the gap between the reflection films of the interference filter to a target dimension which corresponds to a target wavelength is performed based on the electrostatic capacity (a detection capacity) that is detected in the capacity detection circuit, a light with a target wavelength does not pass through the interference filter although control is performed in such a manner that the detection capacity is a capacity that corresponds to the target dimension.

SUMMARY

An advantage of some aspects of the invention is to provide a spectroscopic apparatus that disperses a light with a target wavelength with high precision, a temperature characteristic derivation apparatus that derives a temperature characteristic that is used in the spectroscopic apparatus, a spectroscopic system that includes the spectroscopic apparatus and the temperature characteristic derivation apparatus, a spectroscopy method, and a temperature characteristic derivation method.

A spectroscopic apparatus according to an application example of the invention includes: a spectroscopic module; a temperature detection unit that detects a temperature of the spectroscopic module; and a module control unit that controls the spectroscopic module, in which the spectroscopic module includes an interference filter that has a pair of reflection films and a gap changing unit which changes a dimension of a gap between the pair of reflection films by application of a voltage, and a capacity detection circuit that outputs a detection signal in accordance with an electrostatic capacity between the pair of reflection films, and in which the module control unit corrects a target value of the detection signal that is output from the capacity detection circuit, based on a temperature characteristic of the spectroscopic module and a detection temperature that is detected by the temperature detection unit, and controls the voltage that is to be applied to the gap changing unit, in such a manner that the detection signal that is output from the capacity detection circuit is the corrected target value.

In this application example, the temperature detection unit detects the temperature (a detection temperature) of the spectroscopic module in which the interference filter and the capacity detection circuit are included. Then, when a voltage is applied to the gap changing unit and a light with a target wavelength is caused to pass through the interference filter, the module control unit feedback-controls the voltage that is to be applied to the gap changing unit, based on the detection signal that is output from the capacity detection circuit. On this occasion, the module control unit uses the temperature characteristic of the spectroscopic module and the target value that is corrected based on the detection temperature.

More precisely, in this application example, the target value is corrected based on temperature characteristics of all spectroscopic modules each of which includes the interference filter and the capacity detection circuit, and the voltage that is to be applied to the gap changing unit in such a manner that the detection signal which is output from the capacity detection circuit is the target value is adjusted. Consequently, even in a case where in addition to the temperature of the interference filter, a temperature of the capacity detection circuit changes, a target value that corresponds to the temperature of the capacity detection circuit is set. Accordingly, the light with the target wavelength can be dispersed from an incident light in the spectroscopic apparatus.

In the spectroscopic apparatus according to the application example, the temperature characteristic of the spectroscopic module may include a correction coefficient for the temperature of the spectroscopic module, and the module control unit may input the correction coefficient that corresponds to the detection temperature and the detection temperature into a correction value calculation function that includes the correction coefficient and the temperature, and corrects the target value.

In the application example with this configuration, the temperature characteristic of the spectroscopic module includes a relationship between the temperature of the spectroscopic module and the correction coefficient. Then, the module control unit corrects the voltage by inputting the correction coefficient that corresponds to the detection temperature and the detection temperature into the correction value calculation function. Accordingly, a high-precision target value can be easily set.

Furthermore, a case is also considered where the target value for the detection temperature is retained as table data. However, regarding interference filters that are manufactured in a factory, an individual difference in a shape characteristic or an optical characteristic occurs in each of the interference filters due to the factor such as a manufacture tolerance, and an individual difference also occurs in the capacity detection circuit. Therefore, in a case where the table data is retained, there is a need to generate table data for every spectroscopic module. In contrast, in a case where the voltage is corrected using the correction value calculation function, there is no need to generate the table data as described above, according to the individual spectroscopic module, and the manufacturing cost can be greatly reduced.

In the spectroscopic apparatus according to the application example, the correction coefficient may be derived based on an actual measurement value of a center wavelength of a light passing through the interference filter, which results when the spectroscopic module is caused to change among multiple temperatures and the gap dimension at each temperature is caused to change.

In the application example with this configuration, before light spectral-dispersion processing that disperses a light from the spectroscopic apparatus is performed, the spectroscopic module is caused in advance to change among multiple temperatures, and the dimension of the gap between one pair of reflection films at each temperature is caused to change. Then, the actual measurement value of the center wavelength of the light that passes through the interference filter is acquired at each temperature and in each gap dimension, and the correction coefficient is derived, for example, from an amount of change in the center wavelength per unit temperature. Therefore, using a high-reliability temperature coefficient that is based on the actual measurement value in the spectroscopic module, a correction voltage that results from correcting an original command voltage can be calculated and the precision of light spectral-dispersion can be improved in the spectroscopic apparatus.

In the spectroscopic apparatus according to the application example, the correction coefficients may include a low temperature-side correction coefficient that is derived based on an actual measurement value of the center wavelength at a given reference temperature, and an actual measurement value of the center wavelength at a first temperature that is lower than the reference temperature, and a high temperature-side correction coefficient that is derived based on the actual measurement value of the center wavelength at the reference temperature and on an actual measurement value of the center wavelength at a second temperature that is higher than the reference temperature.

It is noted that, for example, a temperature in an operating environment wherein the spectroscopic apparatus is normally used can be set as the reference temperature, and for example, is set to 23 degrees close to room temperature.

In the application example with this configuration, the voltage is corrected using any one of the low temperature-side correction coefficient in a case where the temperature of the spectroscopic module is lower than the reference temperature and the high temperature-side correction coefficient in a case where the temperature of the spectroscopic module is higher than the reference temperature.

In this case, the derivation of the correction coefficient is easy and the cost of manufacturing the spectroscopic apparatus can be reduced, compared with a case where three or more correction coefficients are used.

In the spectroscopic apparatus according to the application example, in order to cause a light with a target wavelength to pass through the interference filter at a given reference temperature, the module control unit may set a reference voltage value, which is applied to the gap changing unit, to $V_{tini}$, a gain of the output signal of the capacity detection unit to $A_{CV}$, a dielectric constant between the pair of reflection films to $\varepsilon$, an area of the reflection film to $S_m$, the given reference temperature to $T_{ini}$, the gap dimension at the reference temperature $T_{ini}$ to $G_{mTini}$, the correction coefficient to $C_{temp}$, and the detection temperature to T, and calculates a correction voltage $V_{tcali}$, using the correction value calculation function that is expressed in following Equations (1) and (2).

$$V_{tcali} = V_{tini} - \Delta V_t \quad (1)$$

$$\Delta V_t = -A_{CV} \frac{\varepsilon S_m}{G_{mTini}^2} C_{temp}(T - T_{ini}) \quad (2)$$

In the application example with this configuration, the module control unit can simply calculate the amount of correction $\Delta V_t$ based on Equation (2). Furthermore, as described above, because the area $S_m$, a gap dimension (an initial gap $G_{mTini}$) at the reference temperature $T_{ini}$, or the like is a specific value, in case where the amount of correction $\Delta V_t$ at the detection temperature T or the correction voltage $V_{tcali}$ is retained in the table data, the cost of manufacturing the interference filter that is manufactured in a factory increases and a data size of the table data also increases. In contrast, by using the correction value calculation function as expressed in each of Equations (1) and (2), a reduction in the manufacturing cost can be achieved, and a capacity of a recording region, such as a memory, can also be decreased.

In the spectroscopic apparatus according to the application example, the temperature characteristic may be derived from inputting the module characteristic of the spectroscopic module into a machine learning model of which an input is set to be a module characteristic that is a characteristic of the spectroscopic module, and of which an output is set to be the temperature characteristic.

In the application example with this configuration, the module characteristic of the spectroscopic module is input into the machine learning model of which an input is set to be the module characteristic and of which an output is set to be the temperature characteristic, and thus the temperature characteristic is derived.

It is noted that the module characteristic, for example, includes the optical characteristic which includes a transmittance characteristic and the like in the interference filter, the shape characteristic which includes a size, a weight, and the like of the interference filter, the drive characteristic which results from the gap changing unit changing the dimension of the gap between the pair of reflection films of the interference filter, and the like.

The machine learning model is generated by machine learning, for example, based on many spectroscopic modules, the module characteristic and the temperature characteristic of each of which are known. In a case where the temperature characteristic is generated using the machine learning model, there is no need for a process of measuring the temperature characteristic, in which a temperature of each spectroscopic module is caused to change and thus an amount of shift of each wavelength of the light that is output from the spectroscopic module is measured. Because of this, the cost of manufacturing the spectroscopic apparatus can be greatly reduced.

In the spectroscopic apparatus according to the application example, the module characteristic may include an optical characteristic of the interference filter.

The optical characteristic of the interference filter is a relationship to a difference between shapes of the interference filter, which results from changing the dimension of the gap between the pair of reflection films. For example, in a case where the wavelength of the light that passes through the interference filter is shifted toward a short wavelength, the dimension of the gap between the reflection films is decreased. On this occasion, for example, in a case where a configuration is employed in which a substrate that retains the reflection film is caused to be bent and thus the gap dimension is changed, the more the gap dimension is decreased, the more the substrate is bent. Because of this, a half-value width increases and a transmittance decreases.

On the other hand, in a case where the temperature of the spectroscopic module changes, the interference filter that is included in the spectroscopic module is also influenced by the temperature change, and the shape of the interference filter is transformed, for example, due to stress that results from a difference in a linear expansion coefficient between the interference filter and a member that retains the interference filter. Thus, the wavelength of the light that passes through the interference filter is also shifted. That is, there is a correlation between the optical characteristic of the interference filter and the temperature characteristic of the spectroscopic module.

In the application example with this configuration, the module characteristic includes the optical characteristic of the interference filter, and the machine learning model is generated with the module characteristic that includes the optical characteristic of the interference filter, and the temperature characteristic of the spectroscopic module. The module characteristic that includes the optical characteristic of the interference filter is input into the machine learning model, and thus it is possible that the temperature characteristic of the spectroscopic module is derived with high precision.

In the spectroscopic apparatus according to the application example, the optical characteristic may include a transmittance for each wavelength, which results when a light with each wavelength is caused to pass through the interference filter.

As described above, when the dimension of the gap between the reflection films of the interference filter is decreased, the dimension of the gap between the reflection films due to the bending of the reflection film varies greatly, and the transmittance for a light with a transmission center wavelength also decreases. Furthermore, even when the interference filter is bent due to the temperature change, in the same manner, the transmittance for the light with the transmission center wavelength decreases. In the application example with the configuration described above, the optical characteristic includes the transmittance characteristic, and the machine learning model is generated by the module characteristic that includes the optical characteristic that includes the transmittance of the interference filter for each wavelength, and the temperature characteristic of the spectroscopic module. The module characteristic that is the transmittance of the interference filter for each wavelength is input into the machine learning model, and thus it is possible that the temperature characteristic of the spectroscopic module is derived with high precision.

In the spectroscopic apparatus according to the application example, the module characteristic may include a shape characteristic of the interference filter.

In the case of the interference filter that has a configuration in which a moving unit that retains the reflection film is retained by a diaphragm, in addition to size information, such as a plane dimension, a thickness, or the like of the interference filter, the shape characteristic also includes a shape of the diaphragm, a thickness of the diaphragm, or a shape, a plane dimension, a thickness, or the like of the moving portion. Furthermore, the shape characteristic may also include a film material or a film thickness of the reflection film of the interference filter, or a material, Young's modulus, a linear expansion coefficient, or the like of the substrate.

The shape change of the interference filter that results when a temperature of a spectroscopic filter changes is greatly influenced by a shape characteristic of the spectroscopic filter. In the application example with the configuration described above, the module characteristic includes the shape characteristic of the interference filter, and the machine learning model is generated with the module characteristic that includes the shape characteristic of the interference filter, and the temperature characteristic of the spectroscopic module. The module characteristic that includes the shape characteristic of the interference filter is input into the machine learning model, and thus it is possible that the temperature characteristic of the spectroscopic module is derived with high precision.

In the spectroscopic apparatus according to the application example, the module characteristic may include a drive characteristic of the interference filter, which results when a voltage is applied to the gap changing unit.

The drive characteristic of the interference filter, for example, includes the responsiveness (the time taken to reach a desired gap dimension) that results when a voltage is applied to the gap changing unit of the interference filter, the time that it takes for a change in the gap dimension to converge after the desired gap dimension is reached, a vibration frequency that occurs in the interference filter, or the like.

The drive characteristic of the interference filter is influenced by the shape of the interference filter. Furthermore, as described above, the shape change of the interference filter in the case where the temperature of the interference filter changes is influenced by the shape characteristic of the interference filter. That is, there is a strong correlation between the drive characteristic of the interference filter and the temperature characteristic of the spectroscopic module. In the application example with the configuration described above, the module characteristic includes the drive characteristic of the interference filter, and the machine learning model is generated with the module characteristic that includes the drive characteristic of the interference filter, and the temperature characteristic of the spectroscopic module. The module characteristic that includes the drive characteristic of the interference filter is input into the machine learning model, and thus it is possible that the temperature characteristic of the spectroscopic module is derived with high precision.

In the spectroscopic apparatus according to the application example, the interference filter, the capacity detection circuit, and the temperature detection unit may be provided on the same substrate.

In the application example with this configuration, the interference filter, the capacity detection circuit, and the temperature detection unit are provided on the same substrate. Because of this, the temperature changes of the interference filter and the capacity detection circuit can be suitably detected by the temperature detection unit.

A temperature characteristic derivation apparatus according to another application example of the invention derives a temperature characteristic of spectroscopic module which includes an interference filter that has a pair of reflection films and a gap changing unit which changes a dimension of a gap between the pair of reflection films by application of a voltage, and a capacity detection circuit that detects an electrostatic capacity between the pair of reflection films. The apparatus includes: a data accumulation unit that stores characteristic data which results from associating a module characteristic of each of the multiple spectroscopic modules and an actual measurement value of the temperature characteristic, in a storage unit for accumulation; a model generation unit that generates a machine learning model of which an input is set to be the module characteristic and of which an output is set to be the temperature characteristic, from the characteristic data; a target module characteristic acquisition unit that acquires the module characteristic of the spectroscopic module which is a target for deriving a temperature characteristic, as a target module characteristic; and a temperature characteristic acquisition unit that inputs the target module characteristic into the machine learning model and thus obtains the temperature characteristic.

In this application example, the temperature characteristic derivation apparatus that derives the temperature characteristic, which is used in the spectroscopic apparatus is provided. In the temperature characteristic derivation apparatus, the data accumulation unit accumulates pieces of characteristic data, each of which results from associating the actual measurement values of the module characteristic and the temperature characteristic at a reference temperature of each of the multiple spectroscopic modules, in the storage unit. It is noted that the module characteristic, for example, includes the optical characteristic which includes the transmittance characteristic in the interference filter, the shape characteristic which includes a size, a weight, or the like of the interference filter, the drive characteristic that results when the dimension of the gap between the pair of reflection films of the interference filter is changed by the gap changing unit, and the like.

Then, the model generation unit generates the machine learning model of which an input is set to be the module characteristic and of which an output is set to be the temperature characteristic, by performing the machine learning that uses the pieces of characteristic data that are accumulated in the accumulation unit.

Then, the target module characteristic acquisition unit acquires the module characteristic (the target module characteristic) of the spectroscopic module of which the temperature characteristic is unknown, and the temperature characteristic acquisition unit inputs the acquired target module characteristic into the machine learning model and thus acquires the temperature characteristic that is output.

In a case where the spectroscopic modules are manufactured in a factory, normally, the module characteristic of each spectroscopic module is inspected before being shipped from the factory. Results of the inspection are accumulated in the accumulation unit, and thus the machine learning model can be generated with many pieces of characteristic data as pieces of teacher data and it is possible that the temperature characteristic of the spectroscopic module is estimated with high precision from the module characteristic. Therefore, in this application example, the temperature characteristic can be easily obtained only from the module characteristic of the spectroscopic module at the reference temperature.

In the temperature characteristic derivation apparatus according to the application example, the module characteristic may include an optical characteristic of the interference filter.

The interference filter that is manufactured in a factory or the like has a somewhat tolerance in the optical characteristic depending on a manufacturing circumstance. That is, a light transmittance that results when a light with each wavelength is caused to pass through, a half-value width in a transmission spectrum, which indicates an amount of transmitted light, and the like have their respective specific values due to an error in the film thickness of the reflection film of each of the interference filters, the flatness of the substrate, or the like.

The optical characteristic has a relationship to the shape of the interference filter that results when the gap dimension of the pair of reflection films is changed. For example, in the case where the wavelength of the light that passes through the interference filter is shifted toward a short wavelength, the dimension of the gap between the reflection films is decreased. On this occasion, for example, in a case where a configuration is employed in which a substrate that retains the reflection film is caused to be bent and thus the gap dimension is changed, the more the gap dimension is decreased, the more the substrate is bent. Because of this, a half-value width increases and a transmittance decreases.

On the other hand, in the case where the temperature of the spectroscopic module changes, the interference filter that is included in the spectroscopic module is also influenced by the temperature change, and the shape of the interference filter is transformed, for example, due to the stress that results from a difference in a linear expansion coefficient between the interference filter and a member that retains the interference filter. Thus, the wavelength of the light that passes through the interference filter is also shifted. That is, there is a correlative correlation between the optical characteristic of the interference filter and the temperature characteristic of the spectroscopic module.

Thus, in the application example with the configuration described above, the module characteristic that includes the optical characteristic of the interference filter is measured, the measured module characteristics are accumulated as pieces of characteristic data, and based on the pieces of characteristic data, the machine learning model is generated. Accordingly, the machine learning model can be generated that possibly predicts the temperature characteristic of the spectroscopic module with high precision.

In the temperature characteristic derivation apparatus according to the application example, the optical characteristic may include a transmittance for each wavelength, which results when a light with each wavelength is caused to pass through the interference filter.

As described above, when the dimension of the gap between the reflection films of the interference filter is decreased, the dimension of the gap between the reflection films due to the bending of the reflection film varies greatly, and the transmittance for a light with a transmission center wavelength also decreases. Furthermore, even when the interference filter is bent due to the temperature change, in the same manner, the transmittance for the light with the transmission center wavelength decreases. In the application example with the configuration described above, because the optical characteristic includes the transmittance characteristic, the machine learning model can be generated that possibly outputs the temperature characteristic in accordance with the optical characteristic of the interference filter with high precision.

In the temperature characteristic derivation apparatus according to the application example, the module characteristic may include a shape characteristic of the interference filter.

In the case of the interference filter that has a configuration in which a moving unit that retains the reflection film is retained by a diaphragm, in addition to size information, such as a plane dimension, a thickness, or the like of the interference filter, the shape characteristic also includes a shape of the diaphragm, a thickness of the diaphragm, or a shape, a plane dimension, a thickness, or the like of the moving portion. Furthermore, the shape characteristic may also include a film material or a film thickness of the reflection film of the interference filter, or a material, Young's modulus, a linear expansion coefficient, or the like of the substrate.

The shape change of the interference filter that results when a temperature of a spectroscopic filter changes is greatly influenced by a shape characteristic of the spectroscopic filter. For example, the module characteristic of the spectroscopic module includes the shape characteristic of the interference filter, and thus the machine learning model can be generated that possibly derives the temperature characteristic in accordance with the shape characteristic of the interference filter with high precision.

In the temperature characteristic derivation apparatus according to the application example, the module characteristic may include a drive characteristic of the interference filter, which results when a voltage is applied to the gap changing unit.

The drive characteristic of the interference filter, for example, includes the responsiveness (the time taken to reach a desired gap dimension) that results when a voltage is applied to the gap changing unit of the interference filter, the time (the stabilization time) that it takes for the change in the gap dimension to converge after the desired gap dimension is reached, the vibration frequency that occurs in the interference filter, or the like.

The drive characteristic of the interference filter is influenced by the shape of the interference filter. Furthermore, as described above, the shape change of the interference filter in the case where the temperature of the interference filter changes is influenced by the shape characteristic of the interference filter. That is, there is a strong correlation between the drive characteristic of the interference filter and the temperature characteristic of the spectroscopic module. Therefore, based on the module characteristic that includes the drive characteristic of the interference filter and on the temperature characteristic, the machine learning model can be generated that possibly derives the temperature characteristic in accordance with the drive characteristic of the interference filter with high precision.

A spectroscopic system according to another application example includes a spectroscopic apparatus and a temperature characteristic derivation apparatus according as described above, with the spectroscopic apparatus and the temperature characteristic derivation apparatus being communicatively connected to each other, in which the spectroscopic apparatus includes a module characteristic measurement unit that measures a module characteristic at a given reference temperature of the spectroscopic module, and a communication unit that transmits the module characteristic to the temperature characteristic derivation apparatus and receives the temperature characteristic that is transmitted from the temperature characteristic derivation apparatus, in which the target module characteristic acquisition unit acquires the module characteristic that is transmitted from the spectroscopic apparatus, as the target module characteristic, and in which the temperature characteristic acquisition unit transmits the temperature characteristic that is output from the machine learning model, to the spectroscopic apparatus.

In this application example, the spectroscopic apparatus measures the module characteristic using the module characteristic measurement unit, and transmits the measured module characteristic, as the target module characteristic, to the temperature characteristic derivation apparatus. Then, in the temperature characteristic derivation apparatus, when the target module characteristic is acquired by the module characteristic acquisition unit from the spectroscopic apparatus, the temperature characteristic acquisition unit inputs the target module characteristic into the machine learning model, acquires the temperature characteristic, and transmits the acquired temperature characteristic to the spectroscopic apparatus. Accordingly, in the spectroscopic apparatus, even in a case where the module characteristic of the spectroscopic module changes over years, the temperature characteristic that corresponds to the changed module characteristic can be easily acquired. Accordingly, the precision of the light spectral-dispersion by the spectroscopic apparatus can be maintained with high precision over a long period of time.

A spectroscopy method according to another application example of the invention is a spectroscopy method in a spectroscopic apparatus that includes a spectroscopic module and a temperature detection unit that detects a temperature of the spectroscopic module, with the spectroscopic module including an interference filter that has a pair of reflection films and a gap changing unit which changes a dimension of a gap between the pair of reflection films by application of a voltage, and a capacity detection circuit that detects an electrostatic capacity between the pair of reflection films, the method including: detecting the temperature of the spectroscopic module using the temperature detection unit; correcting a target value of a detection signal that is output from the capacity detection circuit, based on a temperature characteristic of the spectroscopic module and on a detection temperature that is detected by the temperature detection unit; and controlling the voltage that is to be applied to the gap changing unit in such a manner that the detection signal that is output from the capacity detection circuit is the corrected target value.

In this application example, in the same manner as in the spectroscopic apparatus described above, the temperature of the spectroscopic module that includes the interference filter and the capacity detection circuit is detected, and a voltage that is to be applied to the gap changing unit is corrected based on the temperature of the entire spectroscopic module that includes the interference filter and the capacity detection circuit. For this reason, even in a case where the temperature characteristic of the capacity detection circuit changes, a light with a target wavelength can be dispersed with high precision form an incident light in the spectroscopic apparatus.

A temperature characteristic deviation method according to another application example of the invention is a temperature characteristic derivation method in which a temperature characteristic of a spectroscopic module, which includes an interference filter that has a pair of reflection films and a gap changing unit which changes a dimension of a gap between the pair of reflection films by application of a voltage, and a capacity detection circuit that detects an electrostatic capacity between the pair of reflection films, is derived using a computer, the computer performs: reading characteristic data from an accumulation unit in which pieces of characteristic data each of which results from associating a module characteristic and an actual measurement value of the temperature characteristic at a given reference temperature in the multiple spectroscopic modules, are accumulated, and generating a machine learning model of which an input is set to be the module characteristic and of which an output is set to be the temperature characteristic; acquiring the module characteristic of the spectroscopic module that is a target for deriving a temperature characteristic, as a target module characteristic; and inputting the target module characteristic into the machine learning model and acquiring the temperature characteristic that is output from the machine learning model.

In this application example, in the same manner as in the temperature characteristic derivation apparatus according to the application example, which is described above, the module characteristic is input by performing the machine learning that uses pieces of characteristic data that are accumulated in the accumulation unit, and the machine learning model of which an output is to be the temperature characteristic is generated. For this reason, the temperature characteristic can be easily obtained only from the module characteristic of the spectroscopic module at the reference temperature.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A spectroscopic apparatus according to a first embodiment will be described below.

Figure 1:
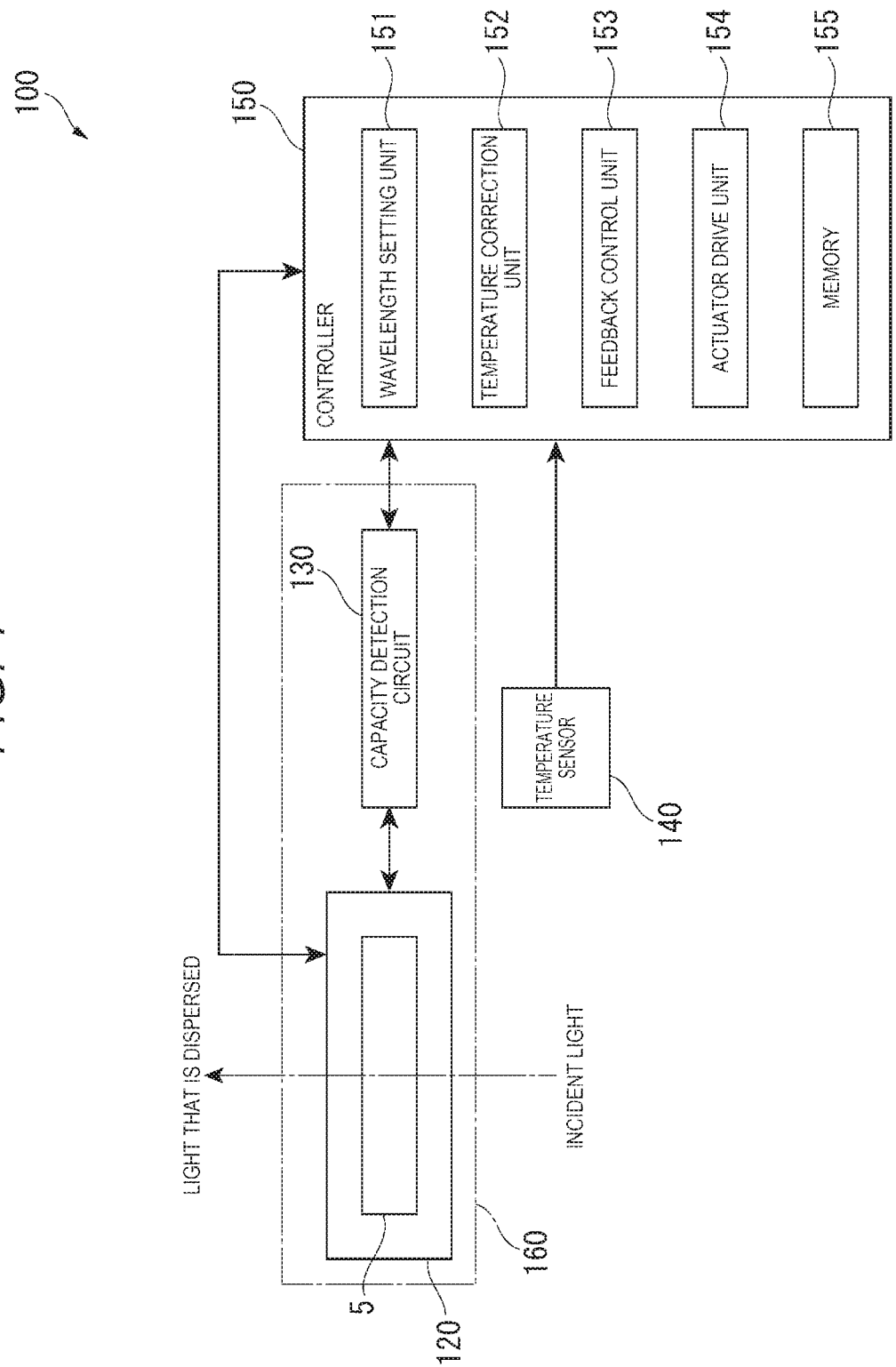
FIG. 1 is a block diagram illustrating a schematic configuration of a spectroscopic apparatus according to a first embodiment.
Figure 2:
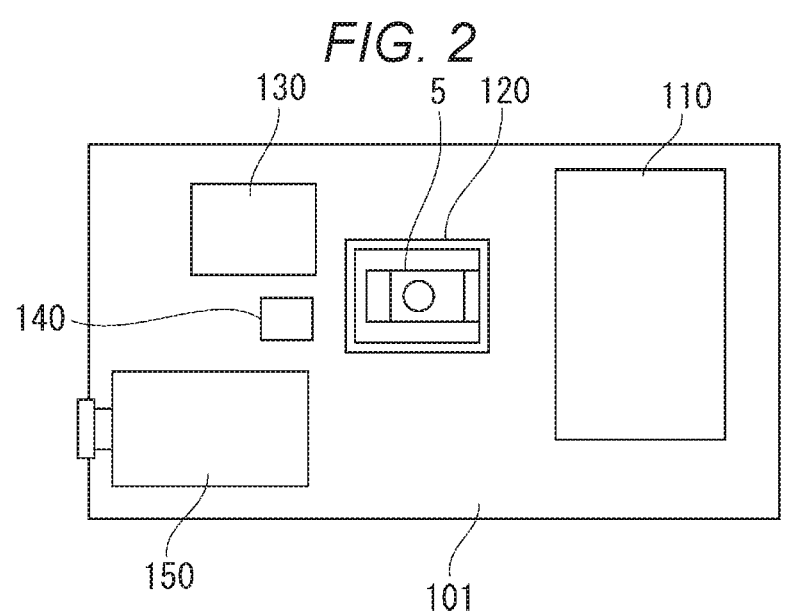
FIG. 2 is a plan-view diagram illustrating the schematic configuration of the spectroscopic apparatus according to the first embodiment.

FIG. 1 is a block diagram illustrating a schematic configuration of a spectroscopic apparatus 100 according to the present embodiment. FIG. 2 is a plan-view diagram illustrating the schematic configuration of the spectroscopic apparatus 100 according to the present embodiment.

Entire Configuration of the Spectroscopic Apparatus 100

The spectroscopic apparatus 100 is an apparatus that disperses a light with a desired target wavelength from an incident light which is input from a measurement target, and outputs the resulting light. The spectroscopic apparatus 100, as illustrated in each of FIGS. 1 and 2, is configured to include a power source 110 (refer to FIG. 2), an optical device 120 that includes a wavelength variable interference filter 5 (an interference filter), a capacity detection circuit 130, a temperature sensor 140 (a temperature detection unit), and a controller 150 (a module control unit). In the present embodiment, the power source 110, the optical device 120, the capacity detection circuit 130, the temperature sensor 140, and the controller 150 are arranged on the same circuit substrate 101 (refer to FIG. 2).

At this point, a spectroscopic module 160 according to the invention is configured with the optical device 120 and the capacity detection circuit 130. As illustrated in FIG. 2, the optical device 120, the capacity detection circuit 130, and the temperature sensor 140 are arranged at positions, respectively, on the circuit substrate 101, which are in close proximity to each other.

Each configuration will be described in detail below.

Power Source 110

The power source 110 is connected to, for example, electric power supply sources of a battery such as a secondary battery, a wiring plug connection, a personal computer, and the like. Furthermore, the power source 110 has a power source circuit that converts an electric power that is supplied from the electric power supply source, into an electric power suitable for each constituent element of the spectroscopic apparatus 100, and supplies an electric power that results from the conversion, to the constituent element.

Optical Device 120

Figure 3:
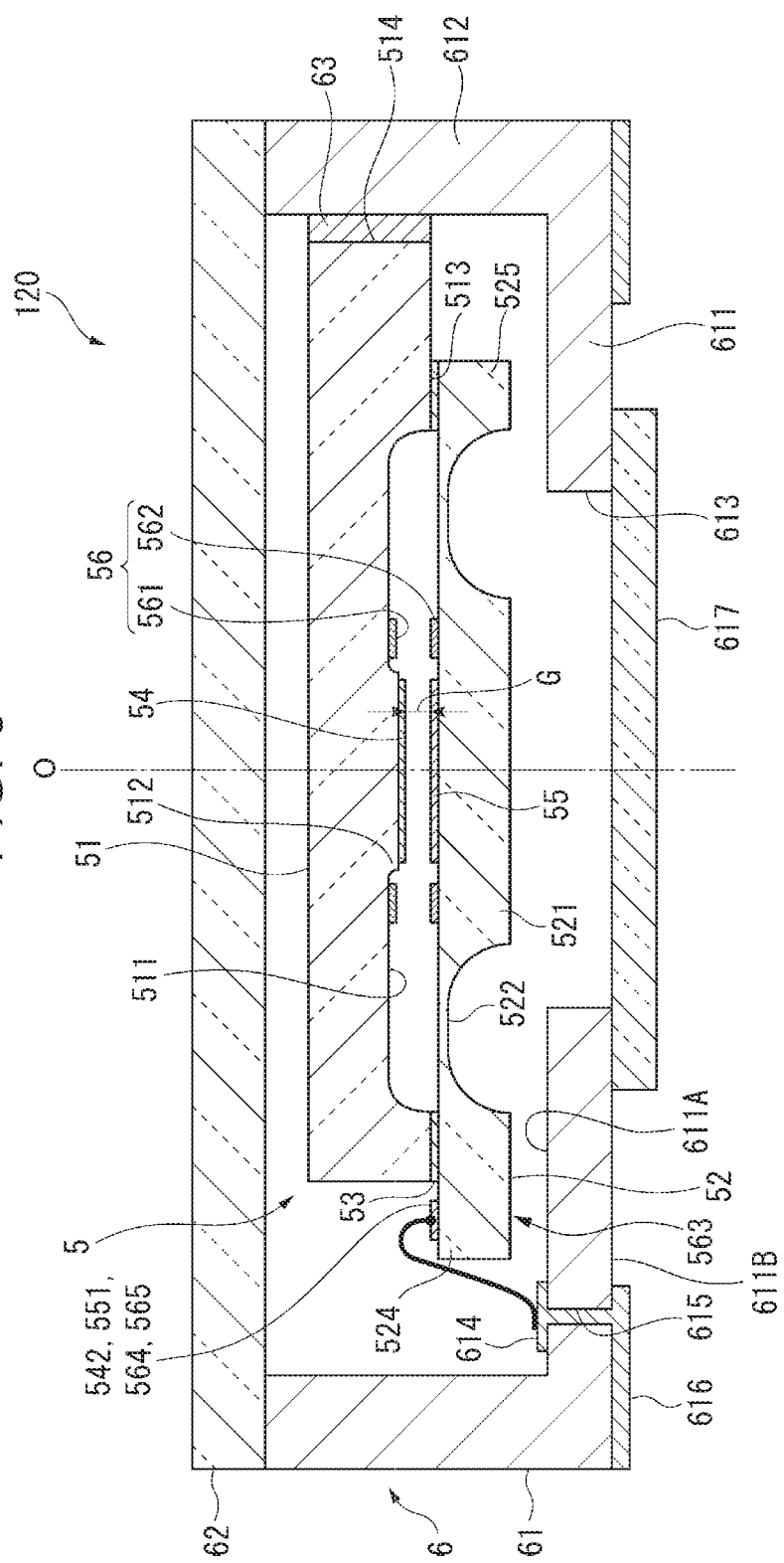
FIG. 3 is a cross-sectional diagram illustrating a schematic configuration of an optical device according to the first embodiment.

FIG. 3 is a cross-sectional diagram illustrating a schematic configuration of the optical device 120 according to the present embodiment.

As illustrated in FIG. 3, the optical device 120 includes the wavelength variable interference filter 5 (the interference filter) and a casing 6 that accommodates the wavelength variable interference filter 5. Furthermore, the casing 6 includes a base 61 and a lid 62. The base 61 and the lid 62 are joined, and thus a housing space is formed inside and the wavelength variable interference filter 5 is accommodated into the housing space. It is preferable that the housing space in the casing 6 is maintained in a decompressed state (for example, in a vacuum).

Wavelength Variable Interference Filter 5

Figure 4:
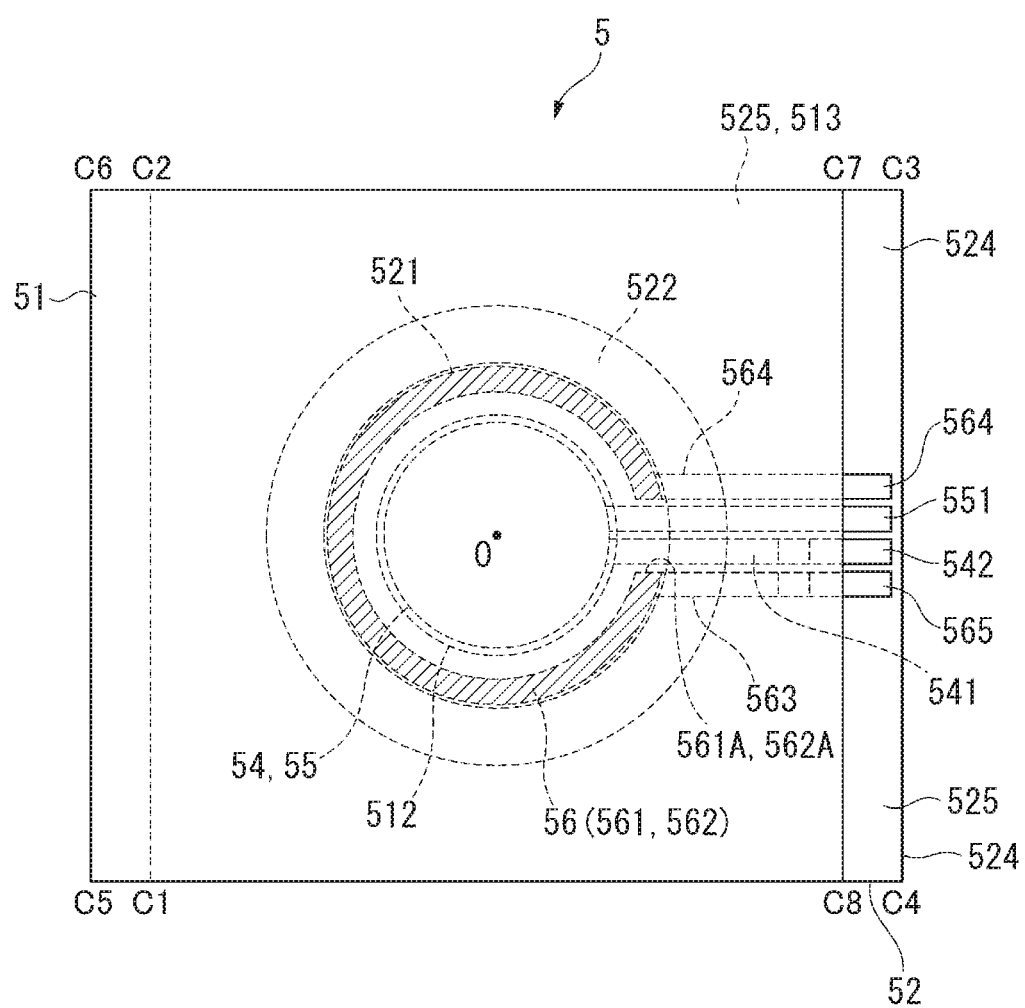
FIG. 4 is a plan-view diagram illustrating a schematic configuration of a wavelength variable interference filter according to the first embodiment.

FIG. 4 is a plan-view diagram illustrating a schematic configuration of the wavelength variable interference filter 5.

The wavelength variable interference filter 5, as illustrated in FIG. 4, is, for example, an optical member in the shape of a rectangle. The wavelength variable interference filter 5, as illustrated in FIG. 3, includes a first substrate 51 and a second substrate 52. The first substrate 51 and the second substrate 52 are joined with, for example, a joining film 53, such as a plasma polymerized film, of which a principal component is siloxane, and thus are configured into one piece.

A first reflection film 54 that constitutes one of the reflection films in a pair is provided on the first substrate 51, and a second reflection film 55 that constitutes the other one of the reflection films in a pair is provided on the second substrate 52. The first reflection film 54 and the second reflection film 55 are positioned in a manner that faces other with a gap G in between. Furthermore, an electrostatic actuator 56 (a gap changing unit that is a shaded portion which is illustrated in FIG. 4) that changes a dimension of the gap G is included in the wavelength variable interference filter 5.

A configuration of each unit will be described in detail below.

Configuration of the First Substrate 51

The first substrate 51 includes an electrode positioning groove 511 and a reflection film installation portion 512 that are formed by, for example, etching, in a surface thereof, which faces the second substrate 52. One end side (for example, a side C5-C6 in FIG. 4) of the first substrate 51 includes a fixation end 514 that protrudes beyond one end side (a side C1-C2) of the second substrate 52. The fixation end 514, as illustrated in FIG. 3, is fixed to the casing 6 with a fixation member 63 in between.

The electrode positioning groove 511 is formed in the shape of approximately a ring of which the center is a given filter center axis O, in a plane view in which the first substrate 51 is viewed from the substrate thickness direction (which is hereinafter referred to simply as a plane view). The reflection film installation portion 512 is formed to protrude from the center portion of the electrode positioning groove 511 toward the second substrate 52 in the plane view. Then, a first electrode 561 that constitutes the electrostatic actuator 56 is positioned on a groove bottom surface of the electrode positioning groove 511, and the first reflection film 54 is positioned on a protruding top surface of the reflection film installation portion 512.

Furthermore, an electrode leading-out groove (of which an illustration is omitted) that extends from the electrode positioning groove 511 toward a side C7-C8 is provided in the first substrate 51.

The first electrode 561 is provided on a region of the groove bottom surface of the electrode positioning groove 511, which faces a second electrode 562 of a moving portion 521 that will be described below. The first electrode 561 is formed, for example, in the shape of approximately a ring, and a notch portion 561A that communicates with the inside and the outside of the ring is provided in one portion of the first electrode 561, which is in close proximity to the side C7-C8.

Furthermore, a first leading-out electrode 563 that extends toward the side C7-C8 along the electrode leading-out groove is connected to the first electrode 561. The first leading-out electrode 563 is connected to a first connection electrode 565 that is provided on the second substrate 52 side of the electrode leading-out groove.

It is noted that in the present embodiment, a configuration in which one first electrode 561 is provided is described, but that, for example, a configuration (a double electrode configuration) or the like in which two electrodes that are in the shape of concentric circles of which the center is the filter center axis O are provided may be employed.

The first reflection film 54, as illustrated in FIG. 3, is provided on a top end surface of the reflection film installation portion 512. For the first reflection film 54, for example, a metal film such as Ag, or an alloy film such as an Ag alloy, can be used. Furthermore, a third leading-out electrode 541 that extends by way of the notch portion 561A in the first electrode 561 up to the electrode leading-out groove is connected to the first reflection film 54. The third leading-out electrode 541 is connected to a third connection electrode 542 that is provided on the second substrate 52 side of the electrode leading-out groove.

It is noted that, as the first reflection film 54, for example, a dielectric multilayer may be used in which a high refractive layer is $TiO_2$ and a low refractive layer is $SiO_2$. In this case, a conductive film, such as a metal film (or an alloy film), is stacked on a dielectric multilayer, and the third leading-out electrode 541 may be connected to the conductive layer.

One portion of a surface facing the second substrate 52, of the first substrate 51, in which the electrode positioning groove 511, the reflection film installation portion 512, and the electrode leading-out groove are not formed by etching, constitutes a joining portion 513 that is joined to the second substrate 52.

Configuration of the Second Substrate 52

In the plane view as illustrated in FIG. 4, the second substrate 52 includes the moving portion 521 in the shape of a circle, of which the center is the filter center axis O, a retention portion 522 (a diaphragm) that retains the moving portion 521 which has the same axis as the moving portion 521, and a substrate peripheral-portion 525 that is provided outside of the retention portion 522. Furthermore, one end side (in the direction of a side C3-C4) of the second substrate 52 protrudes more outward than the side C7-C8 of the first substrate 51, and constitutes an electric portion 524.

The moving portion 521 is formed to have a larger thickness dimension than the retention portion 522, and for example, in the present embodiment, is formed to have the same thickness dimension as that of the substrate peripheral-portion 525. The moving portion 521 is formed to have a diameter dimension larger than a diameter dimension of a peripheral edge of at least the reflection film installation portion 512 in the plane view. Then, the second electrode 562 and the second reflection film 55 are provided on the moving portion 521.

The second electrode 562 faces the first electrode 561, and is formed to have the same shape of approximately a ring as the first electrode 561. In the same as the first electrode 561, the second electrode 562 includes a notch portion 562A in one portion in the direction of the side C3-C4, of the second electrode 562 itself.

Then, a second leading-out electrode 564, which extends from a peripheral edge of the second electrode 562, through a region which faces the electrode leading-out groove in the first substrate 51, up to the electric portion 524, is formed on the second electrode 562. For example, a wiring line, such as a flexible printed circuit (FPC) or a lead wire, is connected to the second leading-out electrode 564 in the electric portion 524, and thus the second leading-out electrode 564 is electrically connected to the controller 150.

The second reflection film 55 is provided on the center portion of the moving portion 521 in a manner that faces the first reflection film 54 with the gap G in between. As the second reflection film 55, a reflection film that has the same configuration as the first reflection film 54 described above is used.

A fourth leading-out electrode 551, which extends by way of the notch portion 562A in the second electrode 562 and then through the region that faces the electrode leading-out groove up to the electric portion 524, is connected to the second reflection film 55. For example, a wiring line, such as a flexible printed circuit (FPC) or a lead wire, is connected to the fourth leading-out electrode 551 in the electric portion 524, and thus the fourth leading-out electrode 551 is electrically connected to the capacity detection circuit 130.

Furthermore, the first connection electrode 565 and the third connection electrode 542 that are provided over a distance from a region that faces an electrode facing groove to the electric portion 524 are included in the second substrate 52.

The first connection electrode 565 is connected to the first leading-out electrode 563 that extends up to the electrode facing groove, with, for example, a bump electrode in between. Furthermore, a wire line, such as an FPC, is connected to the first connection electrode 565 in the electric portion 524, and thus the first connection electrode 565 is electrically connected to the controller 150.

The third connection electrode 542 is connected to the third leading-out electrode 541 that extends up to the electrode facing groove, with, for example, a bump electrode in between. Furthermore, a wire line, such as an FPC, is connected to the third connection electrode 542 in the electric portion 524, and thus the third connection electrode 542 is connected to the capacity detection circuit 130.

The retention portion 522 is a diaphragm that surrounds the vicinity of the moving portion 521, and is formed to have a smaller thickness dimension than the moving portion 521. A surface of the second substrate 52, which is opposite in direction to the first substrate 51, is etched to form a concave groove, and thus the retention portion 522 is configured by a bottom portion of the concave groove. The retention portion 522 is easier to bend than the moving portion 521, and with a weak electrostatic attraction, it is possible that the moving portion 521 is displaced toward the first substrate 51 along the film thickness direction of the second reflection film 55.

It is noted that in the present embodiment, the retention portion 522 in the shape of a diaphragm is described as an example, but that, without being limited to this, for example, a configuration or the like is employed in which a retention portion in the shape of a beam, which is positioned at an equal angle distance, is provided with the filter center axis O in the center.

The substrate peripheral-portion 525 is provided outside of the retention portion 522 in the plane view. The substrate peripheral-portion 525 is joined to the first substrate 51.

In the wavelength variable interference filter 5 as described above, a voltage is applied by the controller 150 between the first electrode 561 and the second electrode 562, and thus an electrostatic attraction operates between electrodes and the moving portion 521 is displaced toward the first substrate 51. Accordingly, it is possible that a dimension (gap dimension) of the gap G is changed by a small degree.

Furthermore, the first reflection film 54 and the second reflection film 55 are connected to the capacity detection circuit 130, and thus it is possible that an electrostatic capacity of the gap G between the first reflection film 54 and the second reflection film 55 is detected by a capacity detection circuit.

Casing 6

The casing 6, as described above, is configured with the base 61 and the lid 62. The base 61 is configured as one that is made of, for example, ceramic or the like, and includes a pedestal portion 611 and a sidewall portion 612.

The pedestal portion 611 is configured in the shape of a plate that has an external appearance, for example, in the shape of a rectangle in a filter plane view, and the cylindrical sidewall portion 612 rises up from a peripheral portion of the pedestal portion 611 toward the lid 62.

The pedestal portion 611 includes an opening portion 613 that is bored through the pedestal portion 611 itself, in the thickness direction, along the filter center axis O of the wavelength variable interference filter 5. The opening portion 613 is provided in such a manner as to include a region that overlaps the first reflection film 54 and the second reflection film 55 in a plane view in which the pedestal portion 611 is viewed from the thickness direction, in a state where the wavelength variable interference filter 5 is accommodated in the casing 6.

Furthermore, a light-transmitting member 617 that covers the opening portion 613 is joined to a surface (a base outside-surface 611B) of the pedestal portion 611, which is opposite in direction to the lid 62.

An inside terminal portion 614 is provided on an inside surface (a base inside surface 611A) of the pedestal portion 611, which faces the lid 62. The inside terminal portion 614 is provided in a manner that corresponds to each of the electrodes (the first connection electrode 565, the second leading-out electrode 564, the third connection electrode 542, and the fourth leading-out electrode 551) that are provided on the electric portion 524 of the wavelength variable interference filter 5, and is connected to a corresponding electrode by a wiring line such as a lead wire or a FPC.

Furthermore, a through-hole 615 is formed in a position on the pedestal portion 611, in which the inside terminal portion 614 is provided. The inside terminal portion 614 is connected to an outside terminal portion 616 that is provided in the base outside-surface 611B of the pedestal portion 611, through the through-hole 615. When the casing 6 is positioned on the circuit substrate 101, the outside terminal portion 616 is connected to a wiring line terminal (of which an illustration is omitted) that is provided on the circuit substrate 101, using, for example, solder or the like. Accordingly, as described above, the first reflection film 54 and the second reflection film 55 of the wavelength variable interference filter 5 are connected to the capacity detection circuit 130 from the electric portion 524 through the inside terminal portion 614, the outside terminal portion 616, and a wiring line on the circuit substrate 101. Furthermore, the first electrode 561 and the second electrode 562 are connected to the controller 150 from the electric portion 524 through the inside terminal portion 614, the outside terminal portion 616, and the wiring line on the circuit substrate 101.

The sidewall portion 612 rises up from an edge portion of the pedestal portion 611, an end surface of the sidewall portion 612 that is provided in a manner that surrounds the vicinity of the base inside surface 611A is, for example, a flat surface in parallel with the base inside surface 611A, and the lid 62 is joined to the end surface. The lid 62 is, for example, a transparent member that has an external appearance in the shape of a rectangle in the plane view, and is configured as one that is made of, for example, glass or the like.

Then, the wavelength variable interference filter 5 is fixed to, for example, the sidewall portion 612 of the casing 6, through the fixation member 63. It is noted that, in the present embodiment, the example in which the wavelength variable interference filter 5 is fixed to the sidewall portion 612 is described, but, for example, may be fixed to the pedestal portion 611 without being limited to this.

Furthermore, the wavelength variable interference filter 5 is connected to the casing 6, at one place that is the fixation end 514 of the first substrate 51. Accordingly, it is possible that transfer of stress to the wavelength variable interference filter 5 is suppressed and that bending or inclining of the first reflection film 54 or the second reflection film 55 is effectively suppressed.

Capacity Detection Circuit 130

The capacity detection circuit 130, as illustrated in FIG. 1, is positioned, for example, in a position that is close to the optical device 120 on the circuit substrate 101.

The capacity detection circuit 130, as described above, is electrically connected to the first reflection film and the second reflection film 55, and detects an electrostatic capacity between the first reflection film 54 and the second reflection film 55. Furthermore, the capacity detection circuit 130 outputs a detection signal (a voltage signal) in accordance with the detected electrostatic capacity to the controller 150.

Temperature Sensor 140

The temperature sensor 140, as illustrated in FIG. 1, is positioned in a position that is close to the optical device 120 and the capacity detection circuit 130, on the circuit substrate 101. Accordingly, the temperature sensor 140 detects a temperature of the spectroscopic module 160 that includes the optical device 120 and the capacity detection circuit 130 on the circuit substrate 101. It is noted that, in the present embodiment, the controller 150 and the power source 110 are also arranged on the same circuit substrate 101. Therefore, a temperature of the entire spectroscopic apparatus 100 of which the center is the spectroscopic module 160 is detected by the temperature sensor 140.

The temperature sensor 140 outputs a temperature signal in accordance with the detected temperature (a detection temperature) to the controller 150.

Controller 150

The controller 150 is a controller that controls all operations of the spectroscopic apparatus 100, and constitutes the module control unit according to the invention.

The controller 150, as illustrated in FIG. 1, includes a wavelength setting unit 151, a temperature correction unit 152, a feedback control unit 153, an actuator drive unit 154, and a memory 155. Furthermore, the controller 150 is connected to an interface (of which an illustration is omitted) that connects between the spectroscopic apparatus 100 and an external apparatus, and thus possibly receives a signal from the external apparatus. As the signal from the external apparatus, for example, a signal or the like that designates a target wavelength of light that results from the light spectral-dispersion by the spectroscopic apparatus 100 can be given as an example. It is noted that the spectroscopic apparatus 100 may be configured to have an operation unit to which an input operation by a user is applied, and in this case, is configured in such a manner that an operation signal from the operation unit is input into the controller 150.

Various Pieces of Data that is Stored in Memory 155

Stored in the memory 155 is a drive table in a case where the temperature of the spectroscopic module 160 (a temperature that is detected in the temperature sensor 140) is a given reference temperature (for example, a room temperature of 23° C.). The drive table contains pieces of V-λ data each of which represents a relationship between a voltage value of the detection signal that is output from the capacity detection circuit 130, and a center wavelength of the light that results from the light spectral-dispersion in the spectroscopic apparatus 100. Furthermore, in the drive table, a drive voltage that is applied to the electrostatic actuator 56, for the center wavelength of the light that results from the light spectral-dispersion in the spectroscopic apparatus 100, is further recorded. As a substitute for the wavelength that results from the light spectral-dispersion in the spectroscopic apparatus 100, a gap dimension between the first reflection film 54 and the second reflection film 55 may be recorded.

It is noted that the light that results from the light spectral-dispersion in the spectroscopic apparatus 100 is a light that is output from the spectroscopic module 160, that is, a light that passes through the wavelength variable interference filter 5.

Moreover, a temperature characteristic of the spectroscopic module 160 that is used in the temperature correction unit 152 when performing voltage correction is stored in the memory 155. Specifically, a temperature coefficient (a correction coefficient) for each temperature of the spectroscopic module 160 is stored in the memory 155, for example, in a table data format.

Wavelength Setting Unit 151

The wavelength setting unit 151 sets the wavelength of the light that results from the light spectral-dispersion by the spectroscopic apparatus 100. For example, in a case where the wavelength of the light that results from the light spectral-dispersion in the spectroscopic apparatus 100 is input from the external apparatus or the operation unit, the wavelength setting unit 151 sets the wavelength as a target wave.

Furthermore, the wavelength setting unit 151 reads a voltage for the target length, from the drive table that is stored in the memory 155, and sets the voltage, which is read, as an original command voltage $V_{tini}$ (a pre-correction target value).

Temperature Correction Unit 152

The temperature correction unit 152 calculates a target value (a correction voltage $V_{tcali}$) that results from correcting the original command voltage $V_{tini}$ based on the temperature that is detected by the temperature sensor 140 and on the temperature characteristic of the spectroscopic module 160 that is stored on the memory 155. At this point, in a case where the feedback control unit 153 that will be described below is configured with an analog circuit, the temperature correction unit 152 corrects a voltage value that corresponds to the target value. Furthermore, in a case where the feedback control unit 153 that will be described below is configured with a digital circuit, the temperature correction unit 152 corrects a digital value that corresponds to the target value.

Feedback Control Unit 153

Based on the electrostatic capacity that is detected by the capacity detection circuit 130, the feedback control unit 153 performs feedback control of a voltage that is to be applied to the electrostatic actuator 56, in such a manner that the light which passes through the wavelength variable interference filter 5 is the target.

Specifically, referring to the voltage value of the detection signal that is output from the capacity detection circuit 130, the feedback control unit 153 adjusts a drive voltage that is to be applied to the electrostatic actuator 56, in such a manner that the voltage value of the detection signal is the target value (the correction voltage $V_{tcali}$) that is calculated in temperature correction unit 152.

Actuator Drive Unit 154

The actuator drive unit 154 is a drive circuit (a driver circuit) that drives the electrostatic actuator 56 of the wavelength variable interference filter 5. Under the control of the feedback control unit 153, the actuator drive unit 154 generates a drive voltage at a given voltage value and applies the generated drive voltage to the electrostatic actuator 56.

Operation in the Spectroscopic Apparatus 100

Derivation of Temperature Coefficient

Next, a spectroscopy method that uses the spectroscopic apparatus 100 as described above is described.

In the spectroscopic apparatus 100 according to the present embodiment, for example, with an inspection process that is performed at the time of manufacturing in a factory, the temperature characteristic is measured and the temperate coefficient is derived.

Figure 5:
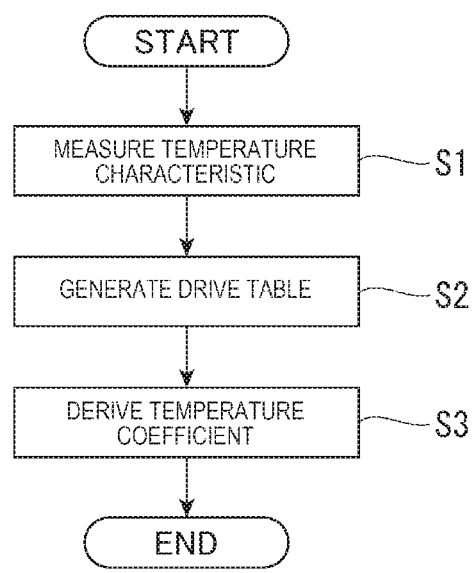
FIG. 5 is a flowchart illustrating a process of deriving a temperature coefficient according to the first embodiment.

FIG. 5 is a flowchart illustrating a process of deriving the temperature coefficient.

During the inspection processing, the temperature characteristic of the manufactured spectroscopic module 160 is first measured (Step S1).

In Step S1, the spectroscopic apparatus 100 is retained within a thermostatic chamber, and a temperature of the thermostatic chamber is adjusted and thus the spectroscopic module 160 is set to be at a given temperature. Then, for example, an optical spectrum causes a known reference light to be incident on the spectroscopic apparatus 100, and causes the voltage, which is to be applied to the electrostatic actuator 56, to be changed. Then, the light that results from the light spectral-dispersion in the spectroscopic apparatus 100 is caused to be incident on a reference spectrometer that is separately prepared, and a center wavelength (hereinafter referred to as a light spectral-dispersion center wavelength) of the light that results from the light spectral-dispersion in the spectroscopic module 160 is measured.

In processing in Step S1, the temperature of the thermostatic chamber is caused to change among multiple temperatures. For example, in the present embodiment, the temperature of the thermostatic chamber is caused to change sequentially to temperatures, in such a manner that the temperature of the spectroscopic module 160 is a reference temperature (for example, a room temperature of 23° C.), a first temperature (for example, 5° C.), that is lower than the reference temperature, and a second temperature (for example, 50° C.) that is higher than the reference temperature. Then, at each temperature, the light spectral-dispersion center wavelength in the spectroscopic module 160, which results when the voltage that is to be applied to the electrostatic actuator 56 is caused to change, is measured.

Next, the drive table for the wavelength variable interference filter 5 is generated (Step S2). The drive table is generated by, for example, a control apparatus that is provided in a factory or the like. The control apparatus is a computer that has a storage circuit and an arithmetic operation circuit, and generates the drive table from an actual measurement value of the temperature characteristic, which is measured in Step S1.

The control apparatus generates the drive table based on the actual measurement value when results when the spectroscopic module 160 is set to be at the reference temperature. For example, the voltage value of the detection signal of the capacity detection circuit 130 is acquired that results from causing a light with each of the wavelengths at a wavelength interval (for example, at an interval of 20 nm) in accordance with resolution of the spectroscopic apparatus 100, which is set in advance, to pass through the wavelength variable interference filter 5, for a target wavelength band (for example, a visible light band from 380 nm to 700 nm) that is set in advance.

Then, the control apparatus derives a temperature coefficient of the spectroscopic module 160 from the actual measurement value in Step S1 (Step S3).

Figure 6:
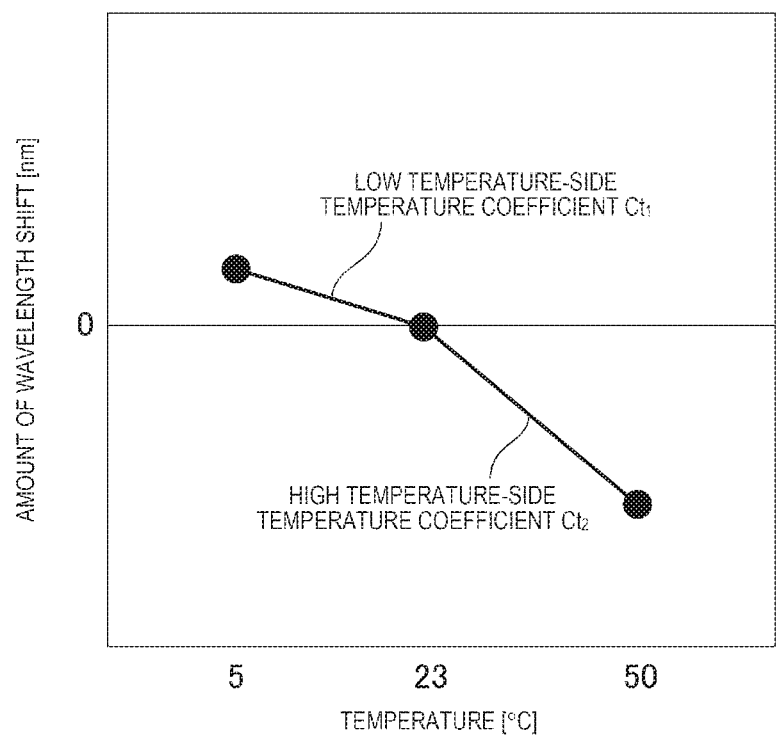
FIG. 6 is a diagram illustrating an example of a temperature characteristic of a spectroscopic module, which is measured in Step S1 according to the first embodiment.

FIG. 6 is a diagram illustrating an example of the temperature characteristic of the spectroscopic module that is measured in Step S1.

In FIG. 6, an amount of shift of the light spectral-dispersion center wavelength that results when a given drive voltage is applied to the electrostatic actuator 56 of the wavelength variable interference filter 5, at each temperature, is illustrated.

The temperature of the spectroscopic module 160 changes, in some cases, bending or inclining takes place in the first reflection film 54 or the second reflection film 55, due to stress in accordance with a difference in linear expansion among units of each of the casing 6, the fixation member 63, and the wavelength variable interference filter 5. Furthermore, in some cases, although the dimension of the gap G is the same, a temperature changes, and thus, a different value is output as a signal value of the detection signal that is output from the capacity detection circuit 130. For example, as illustrated in FIG. 6, when the temperature of the spectroscopic module 160 is caused to change, although a voltage is constant that is to be applied to the electrostatic actuator 56, a wavelength of the light that results from the light spectral-dispersion by the spectroscopic module 160 is shifted.

Thus, in the present embodiment, the control apparatus calculates an amount of wavelength shift per unit temperature as the temperature coefficient from the actual measurement value as illustrated in FIG. 6. More precisely, the control apparatus calculates a low temperature-side temperature coefficient $C_{t1}$ (a low temperature correction coefficient) in a case where the temperature of the spectroscopic module 160 is lower than the reference temperature, using an actual measurement value (the light spectral-dispersion center wavelength) that results when the spectroscopic module 160 is set to be at the first temperature and an actual measurement value that results when the spectroscopic module 160 is set to be at the reference temperature. Furthermore, the control apparatus calculates a high temperature-side temperature coefficient $C_{t2}$ (a high temperature-side correction coefficient) in a case where the temperature of the spectroscopic module 160 is higher than the reference temperature, using an actual measurement value that results when the spectroscopic module 160 is set to be at the second temperature (for example, 50° C.), and an actual measurement value that results when the spectroscopic module 160 is set to be at the reference temperature.

The control apparatus derives a temperature coefficient for each wavelength that is set to be in the drive table. For example, in a case where a drive table for wavelengths in 16 bands at an interval of 20 nm for a visible light band from 380 nm to 700 nm is generated, the temperature coefficient for each of the wavelengths is derived from a temperature characteristic (the amount of wavelength shift) in each of the wavelengths in the 16 bands.

Then, the control apparatus stores the derived temperature coefficient of each of the wavelength in the memory 155 of the spectroscopic apparatus 100.

Spectroscopy Method

Next, a spectroscopy method (light spectral-dispersion processing) that is used when the spectroscopic apparatus 100 that is shipped from a factory disperses a light with a target wavelength from an incident light will be described.

Figure 7:
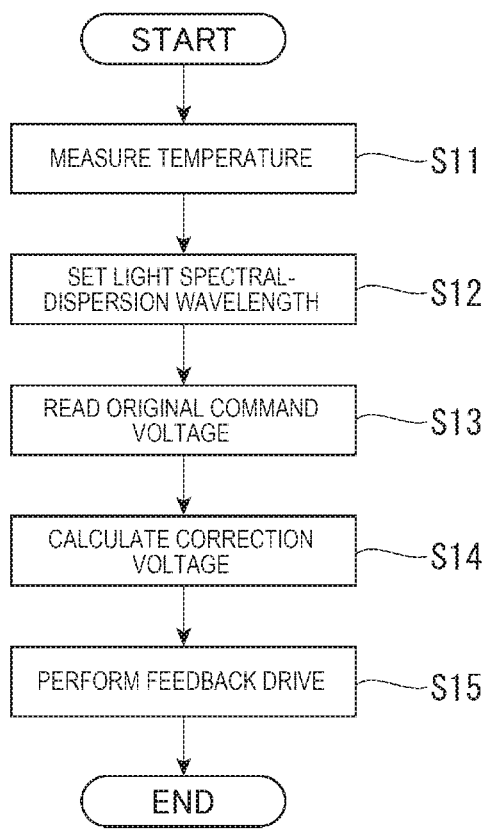
FIG. 7 is a flowchart illustrating a spectroscopy method in the spectroscopic apparatus according to the first embodiment.

FIG. 7 is a flowchart illustrating the spectroscopy method in the spectroscopic apparatus 100 according to the present embodiment.

When performing the light spectral-dispersion processing, the spectroscopic apparatus 100 first measures the temperature of the spectroscopic module 160 using the temperature sensor 140 (Step S11).

Next, the wavelength setting unit 151 sets a light spectral-dispersion wavelength (a wavelength of a light that is caused to pass through the wavelength variable interference filter 5) that is output from the spectroscopic module 160 (Step S12). In Step S12, the wavelength setting unit 151, for example, sets the target wavelength based on a command for setting the light spectral-dispersion wavelength, which is input by a user operating the operation unit of the spectroscopic apparatus 100, and or a command for setting a light spectral-dispersion wavelength that is input from an external apparatus which is communicatively connected with the spectroscopic apparatus 100.

Furthermore, the wavelength setting unit 151 reads the original command voltage $V_{tini}$ that corresponds to the target wavelength, from the drive table that is stored in the memory 155 (Step S13).

Thereafter, the temperature correction unit 152 reads a temperature coefficient $C_{temp}$ that corresponds to a detection temperature T that is detected in Step S11, from the memory 155, inputs the detection temperature T and the temperature coefficient $C_{temp}$ into a correction value calculation function that is expressed in following Equation (2), and calculates an amount $\Delta V_t$ of correction. Moreover, the temperature correction unit 152 calculates a correction voltage $V_{tcali}$ based on following Equation (1) (Step S14).

$$V_{tcali} = V_{tini} - \Delta V_t \quad (1)$$

$$\Delta V_t = -A_{CV} \frac{\varepsilon S_m}{G_{mTini}^2} C_{temp}(T - T_{ini}) \quad (2)$$

It is noted that $A_{CV}$ in the correction value calculation function that is expressed in Equation (2) is a CV conversion gain in the capacity detection circuit 130. $\varepsilon$ is a dielectric constant between the first reflection film 54 and the second reflection film 55. $S_m$ is an area of a region where the first reflection film 54 and the second reflection film 55 overlap in the plane view, as illustrated in FIG. 4. $G_{mTini}$ is an initial dimension of the gap G in the reference temperature, more precisely, a dimension of the gap G in a case where a voltage is not applied to the electrostatic actuator 56. $T_{ini}$ is the reference temperature.

Figure 8:
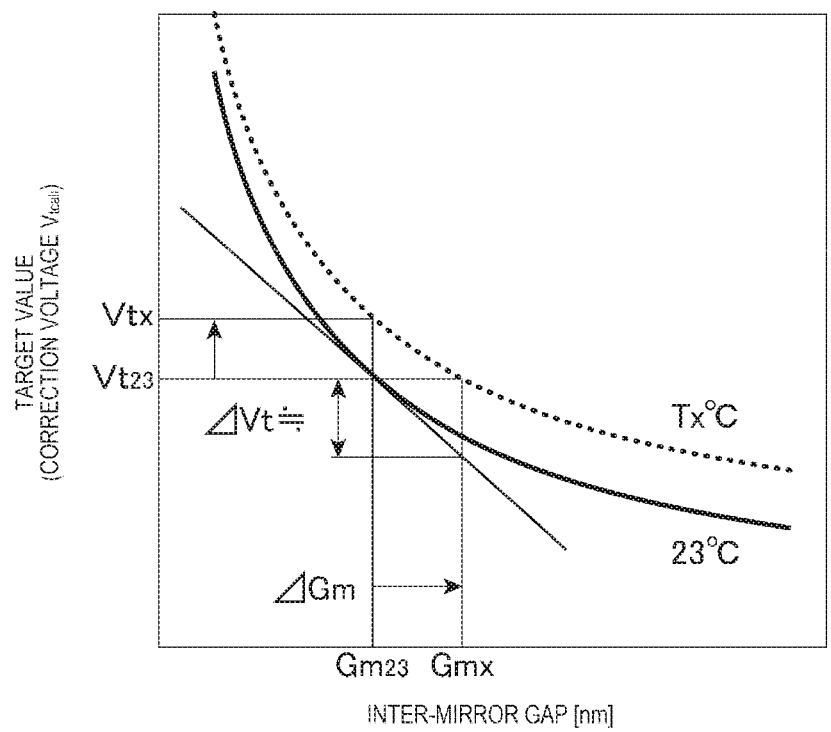
FIG. 8 is a diagram for describing a method of correcting a target voltage (a target value) according to the first embodiment.

FIG. 8 is a diagram for describing a method of correcting a target voltage (a target value) according to the present embodiment.

In FIG. 8, a solid line indicates a relationship between a dimension of the gap G at the reference temperature (23° C.), and a target voltage $V_{23cali}$. Furthermore, a broken line indicates a relationship between a dimension of the gap G at a temperature Tx and a target voltage $V_{txcali}$.

In an example that is illustrated in FIG. 8, in a case where the spectroscopic module 160 is at the reference temperature, a target value for outputting a light with a target wavelength from the spectroscopic module 160 is set to be an original command voltage $V_{t23}$. Accordingly, the light with the target wavelength at which the gap G has a dimension $G_{m23}$ is output from the spectroscopic module 160.

At this point, then the spectroscopic module 160 changes from the reference temperature to the temperate Tx, as illustrated in FIG. 8, the gap G is shifted by $\Delta G_m$ and thus has a dimension $G_{mx}$. More precisely, when an original command voltage $V_{t23}$ is used without correcting the target value when performing the feedback control, a light with a wavelength that corresponds to the dimension $G_{mx}$ is output from the spectroscopic module 160.

In contrast, in the present embodiment, a target value $V_{tx}$ that results from correcting the original command voltage $V_{t23}$ is used as the target value. For this reason, a voltage that is to be applied to the electrostatic actuator 56 is adjusted in such a manner that the dimension of the gap G is $G_{m23}$ that corresponds to the target wavelength, and thus the light with the target wavelength is dispersed, with high precision, from the spectroscopic module 160.

Thereafter, the feedback control unit 153 sets a target voltage $V_{tcali}$ calculated in Step S14 to be at the target value, controls the actuator drive unit 154, and thus applies a voltage to the electrostatic actuator 56 of the wavelength variable interference filter 5. More precisely, the voltage that is to be applied to the electrostatic actuator 56 is adjusted and is feedback-driven, in such a manner that the detection signal which is output from the capacity detection circuit 130 is at the target voltage $V_{tcali}$ (in an example in FIG. 8, $V_{tx}$) (Step S15).

It is noted that, in the present embodiment, the example is described in which the feedback control unit 153 is configured with an analog circuit and target voltage $V_{tx}$ that results from correcting the original command voltage $V_{t23}$ is set to be at the target value, but that, in a case where the feedback control unit 153 is configured with a digital circuit, a digital value that results from AD-converting the target voltage $V_{tx}$ may be used as the target value.

Operation and Effect According to the Present Embodiment

The spectroscopic apparatus 100 according to the present embodiment includes the spectroscopic module 160 that includes the wavelength variable interference filter 5 and the capacity detection circuit 130, the temperature sensor 140 (the temperature detection unit) that detects the temperature of the spectroscopic module 160, and the controller 150 (the module control unit). Then, the temperature correction unit 152 of the controller 150 corrects the target value of the detection signal from the capacity detection circuit 130, based on the temperature characteristic of the spectroscopic module 160 and the detection temperature that is detected by the temperature sensor 140, and adjusts the voltage that is to be applied to the electrostatic actuator 56, in such a manner that the detection signal from the capacity detection circuit 130 is at the target value.

In the present embodiment, the target value is corrected based on the temperature characteristic of the entire spectroscopic module 160 that includes the wavelength variable interference filter 5 and the capacity detection circuit 130. Consequently, the precision of the light spectral-dispersion by the spectroscopic apparatus 100 can be increased compared with a case where the target value is changed based on only the temperature characteristic of the wavelength variable interference filter 5.

In the present embodiment, the temperature coefficient $C_{temp}$ (the correction coefficient) for the temperature of the spectroscopic module 160 is included as the temperature characteristic of the spectroscopic module 160. Then, the controller 150 inputs the temperature coefficient $C_{temp}$ and the detection temperature T into the correction value calculation function that is expressed of each in Equations (1) and (2), corrects the original command voltage $V_{tini}$, and obtains the correction voltage $V_{tcali}$.

Accordingly, based on Equations (1) and (2), the target voltage $V_{tcali}$ can be set with ease and with high precision.

Furthermore, the target voltage $V_{tcali}$ for the detection temperature T may be retained as table data, but in this case, because the target voltage $V_{tcali}$ is necessary for every temperature and for every wavelength, the memory 155 is used to almost its full memory capacity. Furthermore, the wavelength variable interference filters 5 that are manufactured in a factory have their respective individual differences due to the factor such as a manufacture tolerance, and the capacity detection circuit 130 also have their respective individual differences. Therefore, in a case where the table data is retained, there is a need to generate table data for every spectroscopic module 160. In contrast, in the present embodiment, there is no need to generate the table data in accordance with each of the spectroscopic modules 160, and the manufacturing cost can be greatly reduced.

In the present embodiment, the temperature coefficient $C_{temp}$ is derived during the inspection process at the time of the manufacturing of the spectroscopic modules 160 in a factory. During the inspection process, the temperature coefficient $C_{temp}$ is derived based on an actual measurement value of a center wavelength of a light that passes through the wavelength variable interference filter 5, which results when the spectroscopic module 160 is caused to change among multiple temperatures and a dimension of the gap G at each temperature is caused to change. Therefore, using a high-reliability temperature coefficient that is based on the actual measurement value in the spectroscopic module 160, the correction voltage $V_{tcali}$ that results from correcting the original command voltage $V_{tini}$ can be calculated and the precision of light spectral-dispersion can be improved in the spectroscopic apparatus 100.

In the present embodiment, the temperature coefficient includes the low temperature-side temperature coefficient $C_{t1}$ that is derived based on the actual measurement value of the light spectral-dispersion center wavelength in the reference point and on the actual measurement value of the light spectral-dispersion center wavelength in the first temperature, and the high temperature-side temperature coefficient $C_{t2}$ that is derived based on the actual measurement value of the light spectral-dispersion in the reference temperature and on the actual measurement value of the light spectral-dispersion center wavelength in the second temperature.

For this reason, the derivation of the temperature coefficient is easy and the cost of manufacturing the spectroscopic apparatus 100 can be reduced, compared with a case where three or more temperature coefficients are used.

Furthermore, a determination of whether the detection temperature T is high or low by comparison against the reference temperature is made, and thus the temperature coefficient $C_{temp}$ can be easily selected. Furthermore, even in a case where the temperature coefficient changes in a non-linear manner with respect to the temperature of the spectroscopic module 160, the low temperature-side and high temperature-side temperature coefficients are understood by comparison against the reference temperature, and thus the temperature that changes in a nonlinear manner can be dealt with.

In the present embodiment, the optical device 120 into which the wavelength variable interference filter 5 is embedded, the capacity detection circuit 130, and the temperature sensor 140 are arranged on the same circuit substrate 101. For this reason, changes in the temperatures of the wavelength variable interference filter 5 and the capacity detection circuit 130 can be suitably detected by the temperature sensor 140.

Moreover, the optical device 120 and the capacity detection circuit 130 are provided on the circuit substrate 101, in such a manner as to be in close proximity to each other, and the temperature sensor 140 is provided in such a manner as to be in close proximity to the optical device 120 and the capacity detection circuit 130. In this arrangement, temperature correlation between the optical device 120 and the capacity detection circuit 130 on the circuit substrate 101 increases. Therefore, for the temperature that is detected in the temperature sensor 140, multiple combinations of the temperature of the wavelength variable interference filter 5 and the temperature of the capacity detection circuit 130 are not employed. Consequently, from the detection temperature T of the temperature sensor 140, an optimal temperature coefficient can be set, and the target value can be properly corrected.

Second Embodiment

Next, a second embodiment will be described.

In the first embodiment described above, each of the spectroscopic modules 160 that are manufactured in a factory is installed in the thermostatic chamber, and the spectroscopic module 160 are caused to change among multiple temperatures. Furthermore, the voltage that is to be applied to the electrostatic actuator 56 at each temperature is caused to change. Thus, the temperature characteristic at each temperature is measured.

However, in the manufacturing of the spectroscopic apparatus 100, normally, the inspection process of individually inspecting a characteristic of a wavelength variable interference filter 5 is performed at the time of the manufacturing of the wavelength variable interference filter 5, and in addition, the temperature characteristic in the spectroscopic module 160 is individually derived. When this is done, a manufacturing process is complex and is at high cost.

Thus, in a second embodiment, a temperature characteristic derivation apparatus and a method that easily derive a temperature characteristic of the spectroscopic apparatus 100 as described in the first embodiment are described.

Schematic Configuration of the Temperature Characteristic Derivation Apparatus 200

Figure 9:
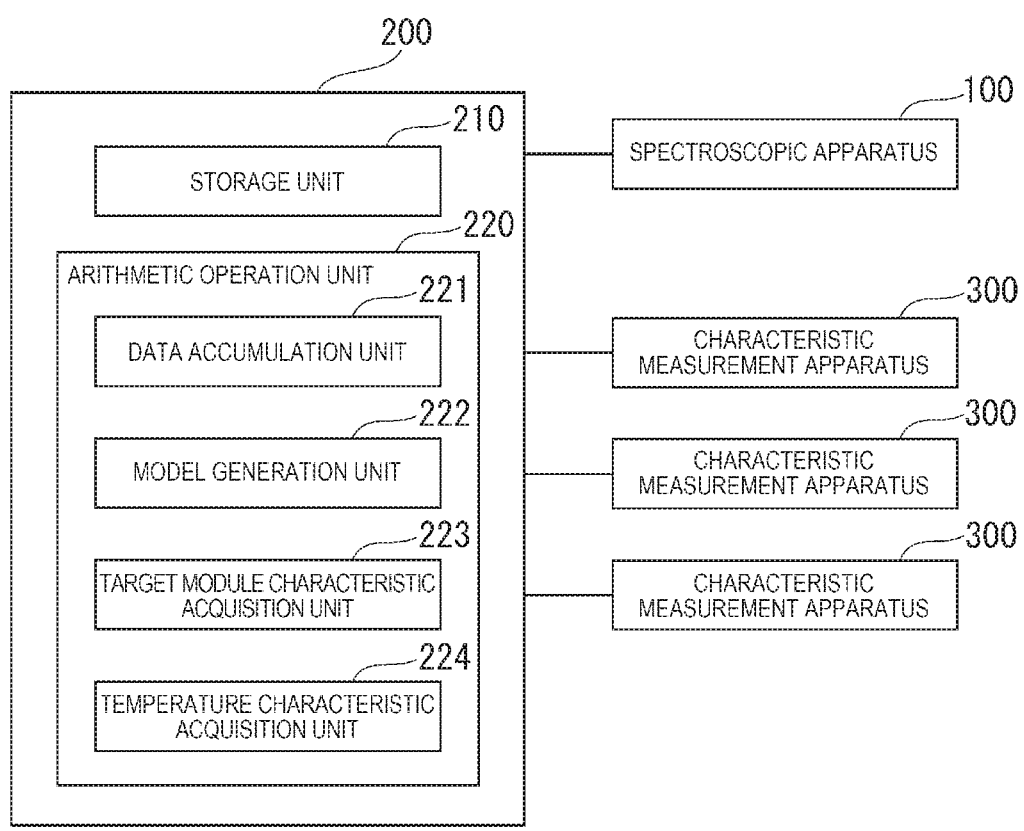
FIG. 9 is a diagram illustrating a schematic configuration of a temperature characteristic derivation apparatus according to a second embodiment.

FIG. 9 is a diagram illustrating a schematic configuration of a temperature characteristic derivation apparatus 200 according to the present embodiment.

The temperature characteristic derivation apparatus 200 is configured with a computer, and includes a storage unit 210 that is configured with a memory, a hard disk, or the like, and an arithmetic operation unit 220 that is configured with a central processing unit (CPU) or the like. Furthermore, the temperature characteristic derivation apparatus 200 is communicably connected to a characteristic measurement apparatus 300 that measures a characteristic of the spectroscopic module 160 or the wavelength variable interference filter 5, or to the spectroscopic apparatus 100. A scheme for communication between the temperature characteristic derivation apparatus 200 and the characteristic measurement apparatus 300 or the spectroscopic apparatus 100 may be one for a wired connection or for a wireless connection without being particularly limited.

Data that is Stored in the Storage Unit 210

The storage unit 210 of the temperature characteristic derivation apparatus 200 includes a characteristic storage region in which characteristic data that results from associating a module characteristic and a temperature characteristic of each of the spectroscopic modules 160 that are manufactured is stored. It is noted that, in the present embodiment, the example is described in which a characteristic data characteristic storage region is provided in the storage unit 210 of the temperature characteristic derivation apparatus 200, but that a characteristic storage region may be provided in a data server which is communicatively connected to the temperature characteristic derivation apparatus 200.

Furthermore, a machine learning model that derives a temperature characteristic from the module characteristic is stored in the storage unit 210.

Moreover, various programs for controlling the temperature characteristic derivation apparatus 200 are stored in the storage unit 210.

The characteristic data that is stored in the storage unit 210 includes the module characteristic and the temperature characteristic, as described above. At this point, the module characteristic represents various characteristics of the spectroscopic module 160, and include a shape characteristic, an optical characteristic, and a drive characteristic of the wavelength variable interference filter 5.

The shape characteristic of the wavelength variable interference filter 5 includes dimensions, such as a width, a depth, and a thickness, or an area in the plane view, of the first substrate 51 or the second substrate 52, a thickness of the first reflection film 54 or the second reflection film 55, a thickness of the first electrode 561 or the second electrode 562, a thickness, or a diameter dimension or an area in the plane view, of the moving portion 521 of the second substrate 52, a depth or a width of a concave groove in the retention portion 522, and a weight or the like of a constituent member of each of the moving portion 521, the first substrate 51, and the second substrate 52.

The optical characteristic of the wavelength variable interference filter 5 includes, for example, a transmittance (or a transmission rate for a light with each wavelength that is calculated with a transmission rate for a light with a wavelength serving as a reference being set to 1) that results when the dimension of the gap G is caused to change and thus a light with each wavelength is caused to pass through. Furthermore, the optical characteristic may include a half-value width in a transmission spectrum, which results when a light with each wavelength is caused to pass through.

A drive characteristic of the wavelength variable interference filter 5 includes, for example, a specific vibration frequency of the moving portion 521, which occurs when the moving portion 521 is caused to be driven, the time (the stabilization time) that it takes for vibration of the moving portion 521 to stop when the gap dimension is set to be at a given value, the responsiveness (the time taken to reach a desired gap dimension) that results when a voltage is applied to the gap changing unit of the interference filter, and the like.

Furthermore, the module characteristic may include a shape characteristic (dimension data) and the like of the casing 6 or the fixation member 63 in the optical device 120, and may include a linear expansion coefficient and the like of the casing 6, the wavelength variable interference filter 5, or the fixation member 63. Moreover, the module characteristic may further include a temperature characteristic of the wavelength variable interference filter 5 alone, a temperature characteristic of the capacity detection circuit 130 alone, and a temperature characteristic of the temperature sensor 140 alone.

The module characteristic of the spectroscopic module 160 is measured in an inspection that is performed during each of the processes of manufacturing each unit (a chip of the wavelength variable interference filter 5 or the capacity detection circuit 130) that constitutes the spectroscopic module 160.

Functional Configuration of the Arithmetic Operation Unit 220

Various programs that are stored in the storage unit 210 are read for execution, and thus, as illustrated in FIG. 9, the arithmetic operation unit 220 functions as a data accumulation unit 221, a model generation unit 222, a target module characteristic acquisition unit 223, and a temperature characteristic acquisition unit 224.

The data accumulation unit 221 receives a result of measurement of the module characteristic or the temperature characteristic of the spectroscopic module 160, which are input from the characteristic measurement apparatus 300, generates the characteristic data, and stores the generated characteristic data for accumulation in the storage unit 210.

The model generation unit 222 generates a machine learning model that estimates the temperature characteristic from the module characteristic, based on multiple pieces of characteristic data that are accumulated in the storage unit 210.

For the generation of the machine learning model by the model generation unit 222, a known machine learning model can be used, and for example, an algorithm for supervised learning (a neural network or the like that uses deep learning) can be used. More precisely, the model generation unit 222 sets many pieces of characteristic data accumulated in the storage unit 210 as pieces of teacher data, and generates the machine learning model of which an input is set to be each of the characteristics (a shape characteristic, an optical characteristic, a drive characteristic, and the like of the wavelength variable interference filter 5) that are included in the module characteristic and of which an output is set to be the temperature characteristic of the spectroscopic module 160.

The target module characteristic acquisition unit 223 acquires the module characteristic of the spectroscopic module 160, of which the temperature characteristic is unknown and which is a target for estimating the temperature characteristic, as a target module characteristic.

The temperature characteristic acquisition unit 224 inputs the target module characteristic into the machine learning model, and acquires the temperature characteristic, which is output, as the temperature characteristic of the spectroscopic module 160. Then, the temperature characteristic is stored in the memory 155 of the spectroscopic apparatus 100 that is equipped with the spectroscopic module 160 that is a target.

Relationship Between the Module Characteristic and the Temperature Characteristic In the present embodiment, the machine learning model that estimates the temperature characteristic is generated from the module characteristic. On this occasion, machine learning is performed using the module characteristic that has a close relationship to the temperature characteristic of the spectroscopic module, with the module characteristic including various characteristics, and thus the machine learning model can be generated that possibly outputs a high-precision temperature characteristic.

In the present embodiment, the module characteristic includes the optical characteristic, the shape characteristic, and the drive characteristic of the wavelength variable interference filter 5.

Figure 10:
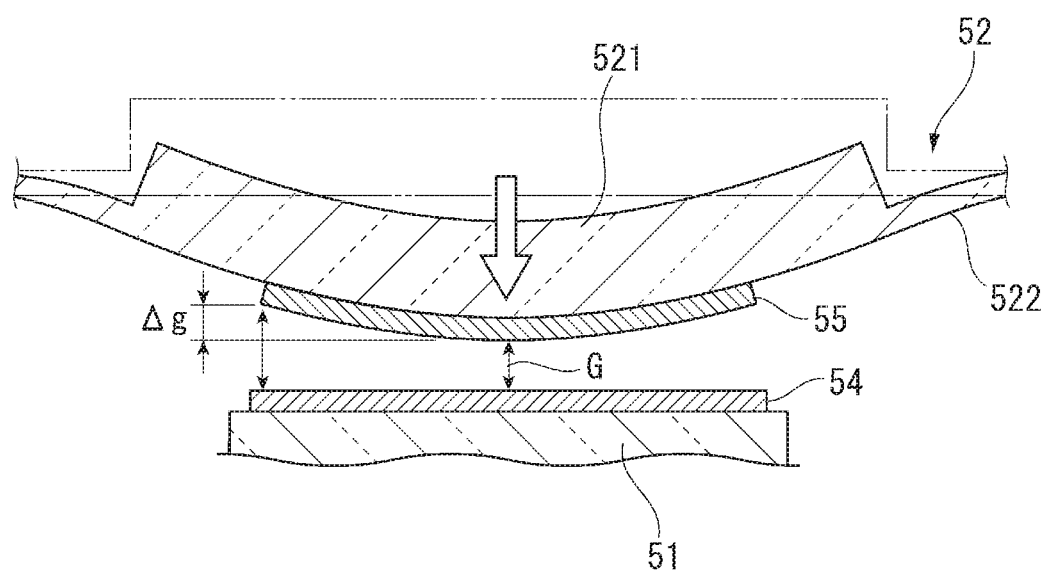
FIG. 10 is a schematic diagram illustrating a change in a dimension of a gap that results when a moving portion of the wavelength variable interference filter is bent toward a first substrate.
Figure 11:
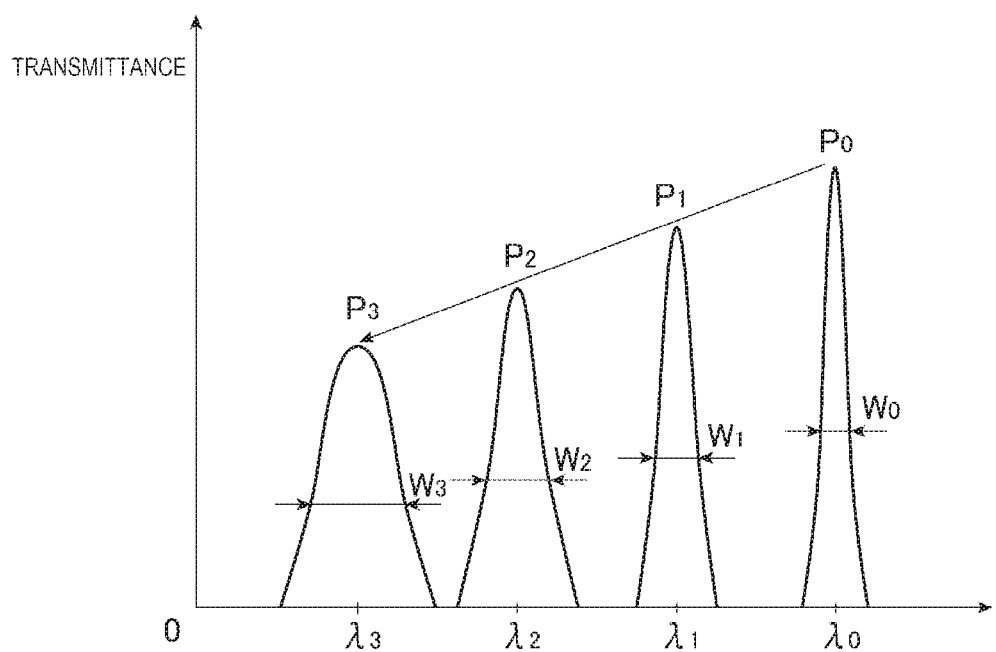
FIG. 11 is a diagram illustrating an example of a transmittance for each wavelength, which is one optical characteristic of the wavelength variable interference filter.

FIG. 10 is a schematic diagram illustrating a change in the demesne of the gap G that results when the moving portion 521 of the wavelength variable interference filter 5 is bent toward the first substrate 51. FIG. 11 is a diagram illustrating a transmittance for each wavelength that is one optical characteristic of the wavelength variable interference filter 5.

The dimension of the gap G of the wavelength variable interference filter 5 is maintained in such a manner that the first reflection film 54 and the second reflection film 55 are in parallel with each other in an initial position in which a voltage is not applied to the electrostatic actuator 56. On the other hand, when a voltage is applied to the electrostatic actuator 56 and the moving portion 521 is moved toward the first substrate 51, as illustrated in FIG. 10, bending takes place in the vicinity of a position of a border between the moving portion 521 and the retention portion 522 of the moving portion 521.

When this bending takes place, as illustrated in FIG. 10, a gap dimension in a position at a distance from the center of the moving portion 521 increases by $\Delta g$ compared with the center of the moving portion 521. Consequently, lights that pass through the wavelength variable interference filter 5 include a light with a wavelength component deviating from the target wavelength, which passes through a bent portion of the moving portion, in addition to a light with the target wavelength, which passes through the center of the moving portion. The more the moving portion 521 is displaced toward the first substrate 51, the more lights with the wavelength component deviating from the target wavelength are present. Therefore, in a case where the degree of the light that is caused to pass through the wavelength variable interference filter is fixed, a transmittance of the wavelength variable interference filter 5 for each wavelength, as illustrated in FIG. 11, decreases as shifting proceeds from the long wavelength to a short wavelength. For example, if the lights that pass through the wavelength variable interference filter 5 are set to be $\lambda_0$, $\lambda_1$, $\lambda_2$, and $\lambda_3$ ($\lambda_0 > \lambda_1 > \lambda_2 > \lambda_3$), respectively, and transmittances that correspond to wavelengths $\lambda_0$, $\lambda_1$, $\lambda_2$, and $\lambda_3$ are set to be $P_0$, $P_1$, $P_2$, and $P_3$, respectively, then, $P_0 > P_1 > P_2 > P_3$. Furthermore, if half-value widths that correspond to wavelengths $\lambda_0$, $\lambda_1$, $\lambda_2$, and $\lambda_3$ are set to be $W_0$, $W_1$, $W_2$, and $W_3$, respectively, then $W_0 < W_1 < W_2 < W_3$.

Furthermore, the moving portion 521 that results when the moving portion 521 as described above is displaced toward the first substrate 51 is bent differently depending on shape characteristics of the wavelength variable interference filter 5, such as the depth or the width of the concave groove in the retention portion 522, a thickness or a magnitude of the moving portion 521, and a magnitude of the first substrate 51 or the second substrate 52. For example, in a case where the depth of the concave groove in the retention portion 522 is great (the thickness of the retention portion 522 is small) and the width thereof is great, the retention portion 522 is easy to bend, and the bending of the moving portion 521 is suppressed to that extent. Furthermore, in a case where the thickness of the moving portion 521 is great, the bending of the moving portion 521 is suppressed.

Moreover, the drive characteristic (the vibration frequency, the responsiveness or the stabilization time that results when the moving portion 521 is moved) that results when the wavelength variable interference filter 5 is driven is influenced by a specific periodicity that is determined by the shape characteristic of the wavelength variable interference filter.

In this manner, there is a correlation among the optical characteristic, the shape characteristic, and the drive characteristic of the wavelength variable interference filter 5.

On the other hand, in a case where the temperature of the wavelength variable interference filter 5 changes, stress builds up in the moving portion 521, and thus a position of the moving portion 521 with respect to the first substrate 51 changes. Consequently, as is the case where a voltage is applied to the electrostatic actuator 56, the bending of the moving portion 521 takes place, and a transmission wavelength is shifted. An amount of shift of the transmission wave is determined by an amount of displacement of the moving portion 521, which results from the stress that builds up in the moving portion 521 due to the change in the temperature. The amount of displacement of the moving portion 521, which results when the stress is given, as described above, is strongly influenced by the shape characteristic of the wavelength variable interference filter 5, and has a correlation to the optical characteristic and the drive characteristic of the wavelength variable interference filter 5.

Therefore, the module characteristic that includes the optical characteristic, the shape characteristic, and the drive characteristic of the wavelength variable interference filter 5 is used, and thus it is possible that the machine learning model that predicts the temperature characteristic with high precision is generated.

Temperature Characteristic Derivation Method

Figure 12:
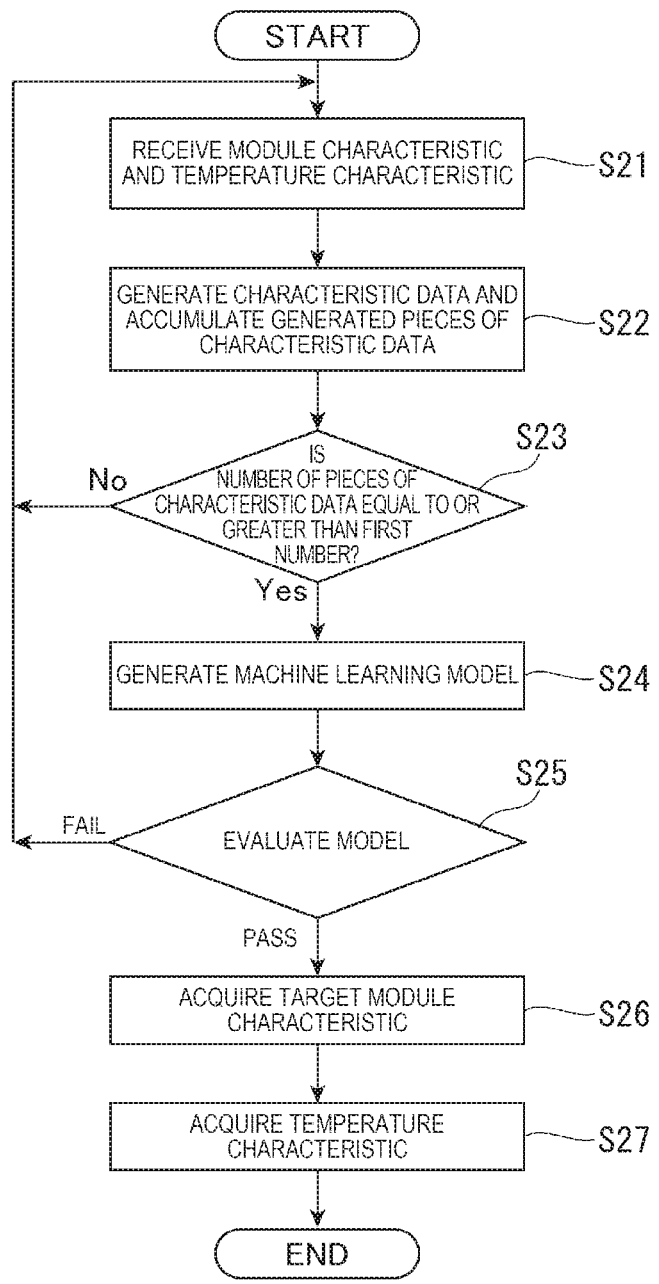
FIG. 12 is a flowchart illustrating a temperature characteristic derivation method according to the present embodiment.

FIG. 12 is a flowchart illustrating a temperature characteristic derivation method according to the present embodiment.

The temperature characteristic derivation apparatus 200 according to the present embodiment derives the temperature characteristic under the condition that the number of pieces of characteristic data which are the pieces of teacher data is equal to or greater than a given first number and that the pieces of characteristic data are stored in the storage unit 210.

For this reason, in the present embodiment, in the same manner as in the first embodiment, the temperature characteristic of each spectroscopic module 160 is measured and the measured temperature characteristic is stored in the memory 155 of the spectroscopic apparatus 100, until pieces of characteristic data, of which the number is equal to or greater than the first number, are accumulated.

At this point, in the present embodiment, when the wavelength variable interference filter 5 is manufactured, each characteristic of the wavelength variable interference filter 5 is measured by the characteristic measurement apparatus 300 that is responsible for measuring the shape characteristic of the wavelength variable interference filter 5, the characteristic measurement apparatus 300 that is responsible for measuring the optical characteristic of the wavelength variable interference filter 5, and the characteristic measurement apparatus 300 that is responsible for measuring the drive characteristic of the wavelength variable interference filter 5. Furthermore, the characteristic measurement apparatus 300 that is responsible for measuring the temperature characteristic of the spectroscopic module 160 measures the temperature characteristic of the spectroscopic module 160.

It is noted that, at this point, the shape characteristic, the optical characteristic, and the drive characteristic of the wavelength variable interference filter 5 are described as examples of the module characteristic, but that, as described above, the module characteristic may include a characteristic of the optical device 120, a characteristic of the capacity detection circuit 130, a characteristic of the temperature sensor 140, and the like, in which case the characteristic measurement apparatus 300 that corresponds to each characteristic makes a measurement.

Module characteristics of these spectroscopic modules 160 are measured during the inspection processing that is normally performed, when each component that constitutes the spectroscopic module 160 is manufactured.

In the present embodiment, it is preferable that each inspection process (except for the measurement of the temperature characteristic) is performed at a reference number (for example, 23° C. or so).

The data accumulation unit 221 of the temperature characteristic derivation apparatus 200 receives the module characteristic of the spectroscopic module 160, which includes the shape characteristic, the optical characteristic, and the drive characteristic of the wavelength variable interference filter 5, and the temperature characteristic of the spectroscopic module 160, from these characteristic measurement apparatuses 300 (Step S21).

Thereafter, the data accumulation unit 221 generates the characteristic data that results from associating the module characteristic of the spectroscopic module 160 and the temperature characteristic of the spectroscopic module 160, and accumulates the generated pieces of characteristic data in the storage unit 210 (Step S22).

It is noted that identification data (ID) is assigned to each of the components (the wavelength variable interference filter 5 or the like) that constitute the spectroscopic apparatus 100, such as the wavelength variable interference filter 5 and the capacity detection circuit 130. Therefore, when assembling the spectroscopic module 160, the ID of each built-in component that is built is stored and thus a characteristic of each component that constitutes each spectroscopic module 160 can be specified.

Then, the model generation unit 222 determines whether or not the number of characteristic data that are accumulated in the storage unit 210 is equal to or greater than the first number (Step S23).

In Step S23, in a case where the result of the determination is No, returning to Step S21 takes place, and the acquisition and accumulation of pieces of characteristic data continue.

On the other hand, in a case where, in Step S23, the result of the determination is Yes, the model generation unit 222 reads the pieces of characteristic data that are accumulated in the storage unit 210, and generates the machine learning model by performing the machine learning (Step S24). On this occasion, the model generation unit 222 may generate the machine learning model based on all pieces of characteristic data that are stored in the storage unit 210, and may randomly select a given number of pieces of characteristic data (for example, half of the pieces of characteristic data that are stored in the storage unit 210) among from the pieces of characteristic data that are stored in the storage unit 210 and thus may generate the machine learning model. In a case where the machine learning model is generated from a given number of pieces of characteristic data, verification of the machine learning model may be performed using the remaining piece of characteristic data.

Next, the model generation unit 222 performs evaluation of the generated machine learning model (Step S25).

At this point, in a case where, in Step S24, the machine learning model is generated using all pieces of characteristic data, the evaluation of the machine learning model is performed using a given second number of pieces of characteristic data that are newly acquired by the data accumulation unit 221.

Furthermore, in a case where, in Step S24, the machine learning model is generated using a given number of pieces of characteristic data and the verification is performed using the remaining pieces of characteristic data, the machine learning model may be evaluated based on a result of the verification and the evaluation of the machine learning model may be performed after the second number of pieces of characteristic data are newly acquired.

In the evaluation of the machine learning model, the model generation unit 222, for example, inputs a module characteristic of characteristic data that is newly acquired for evaluation, into the machine learning model. Then, the temperature characteristic that is output from the machine learning model is compared with a temperature characteristic (a temperature characteristic of characteristic data that is acquired for evaluation) that is a correct solution. In a case where a given percentage (for example, 99%) or more of temperature characteristic that is output from the machine learning model are the same as the temperature characteristic that is a correct solution, a "pass" decision is made. In a case where a percentage of temperature characteristic that is output, which is lower than the given percentage, is the same as the temperature characteristic that is a correct solution, a "fail" decision is made.

In a case where a result of the evaluation of the machine learning model in Step S25 is "fail", returning to Step S21 takes place. Many more pieces of characteristic data are acquired and the generation of the machine learning model is repeated. In this case, In Step S23, it is immediately determined that the result is Yes, and the machine learning model is generated based on multiple pieces of characteristic data that result from adding newly acquired pieces of characteristic data. It is noted that, in a case where the result of the evaluation is "fail" in Step S25, the first number in Step S23 may be increased by a given number.

In a case where the result of the evaluation of the machine learning model is "pass" in Step S25, subsequently, the measurement of the temperature characteristic of the spectroscopic module 160 is periodically is made. More precisely, only the periodic measurement is made without making the measurement of the temperature characteristic of all spectroscopic modules 160. In this case, pieces of characteristic data are periodically accumulated, and the model generation unit 222 can update the machine learning model when new pieces of the characteristic data are accumulated.

Accordingly, with the machine learning model that is based on many more pieces of characteristic data, the precision of the estimation of the temperature characteristic can be further improved.

Then, in a case where the result of the evaluation of the machine learning model in Step S25 is "pass", the target module characteristic acquisition unit 223 acquires the module characteristic of the spectroscopic module 160, from which the temperature characteristic is desired to be obtained, as the target module characteristic (Step S26).

Furthermore, the temperature characteristic acquisition unit 224 outputs the target module characteristic that is acquired in Step S26, into the machine learning model, and acquires the temperature characteristic that is output (Step S27). Moreover, the temperature characteristic acquisition unit 224 stores the acquired temperature characteristic, in the memory 155 of the spectroscopic apparatus 100 into which the spectroscopic module 160 that is a target is built.

Operation and Effect of the Present Embodiment

The temperature characteristic derivation apparatus 200 according to the present embodiment derives the temperature characteristic of the spectroscopic module 160 of the spectroscopic apparatus 100 as described in the first embodiment. In the temperature characteristic derivation apparatus 200, when the module characteristics of multiple spectroscopic modules 160 that are manufactured in a factory, and the actual measurement value of the temperature characteristic of the spectroscopic module 160 are measured, pieces of characteristic data each of which results from associating the module characteristic and the temperature characteristic are accumulated in the storage unit 210. Then, the model generation unit 222 generates the machine learning model of which an input is set to be the module characteristic and of which an output is set to be the temperature characteristic, from multiple pieces of characteristic data that are stored in the storage unit 210. Then, with the target module characteristic acquisition unit 223, the target module characteristic of the spectroscopic module 160 that is a target for deriving the temperature characteristic is acquired. When this is done, the temperature characteristic acquisition unit 224 acquires the temperature characteristic that is output as a result of inputting the target module characteristic into the machine learning model.

In the present embodiment, when the module characteristic of the spectroscopic module 160 is measured, the temperature characteristic of the spectroscopic module 160 can be obtained only by inputting the module characteristic into the machine learning model. Consequently, if the number of pieces of characteristic data that are accumulated increases and thus the precision of the machine learning model is improved, the temperature characteristic of each of the spectroscopic modules 160 does not need to be measured and the cost of manufacturing the spectroscopic apparatus 100 can be reduced.

In the present embodiment, the module characteristic that is to be input into the machine learning model includes the optical characteristic of the wavelength variable interference filter 5.

The wavelength variable interference filter 5 individually includes a somewhat tolerance in the optical characteristic due to the manufacture tolerance, and has a different optical characteristic that results when the wavelength of the light that is caused to pass through is changed. The difference in the optical characteristic has a relationship to a difference in shape (a difference in the shape characteristic) that results when the moving portion 521 is displaced toward the first substrate 51. Furthermore, when the temperature of the spectroscopic module 160 changes, the moving portion 521 is bent due to the stress that results from a difference in the linear expansion coefficient or the like. Thus, the wavelength of the light that passes through the wavelength variable interference filter 5 is shifted. More precisely, there is a correlation between the optical characteristic of the wavelength variable interference filter 5 and the temperature characteristic of the spectroscopic module 160. Therefore, by performing the machine learning that uses the module characteristic which includes the optical characteristic of the wavelength variable interference filter 5 and the temperature characteristic, the machine learning model can be generated that predicts the temperature characteristic of the spectroscopic module 160 with high precision.

Furthermore, the optical characteristic includes a transmittance for each wavelength of the light that passes through the wavelength variable interference filter 5.

A transmittance for the light that passes through the wavelength variable interference filter 5 decreases as a wavelength becomes small. The decreasing rate is due to the shape (an amount of bending) of the moving portion 521 that results mostly when the dimension of the gap G is caused to change, and is influenced by temperature characteristic. Therefore, the machine learning model in which a transmittance for each wavelength is set to be the module characteristic is generated, and thus the temperature characteristic can be obtained with high precision.

Moreover, in the present embodiment, the module characteristic includes the shape characteristic of the wavelength variable interference filter 5.

As described above, a wavelength shift due to the change on the temperature of the wavelength variable interference filter 5 results from transformation of the moving portion 521 due to stress that builds up in the wavelength variable interference filter 5. That is, there is a strong correlation between the temperature characteristic of the spectroscopic module 160 and the shape characteristic of the wavelength variable interference filter 5. Therefore, the machine learning model in which the shape characteristic is set to be the module characteristic is generated, and thus the temperature characteristic of the spectroscopic module 160 can be derived with higher precision.

In the present embodiment, the module characteristic further includes the drive characteristic of the wavelength variable interference filter 5.

There is a strong correlation between the drive characteristic of the wavelength variable interference filter 5 and the shape characteristic of the wavelength variable interference filter 5. Therefore, the drive characteristic also has a correlation to the temperature characteristic of the spectroscopic module 160 that has a strong correlation to the shape characteristic. Therefore, with the machine learning model in which the drive characteristic is set to be the module characteristic, the temperature characteristic of the spectroscopic module 160 can be derived with high precision.

In the present embodiment, the module characteristic, as described above, includes the shape characteristic, the optical characteristic, and the drive characteristic of the wavelength variable interference filter 5. In this manner, in the machine learning model of which inputs are set to be multiple items, which causes the temperature characteristic to be output, it is possible that the temperature characteristic is estimated with high precision, compared with the machine learning model that outputs the temperature characteristic with only one item. Furthermore, in addition to the characteristics described above, the module characteristic may further include the shape characteristic of the optical device 120, the temperature characteristic of only the wavelength variable interference filter 5, the temperature characteristic of only the capacity detection circuit 130, or the like, and may further include the temperature characteristic of the temperature sensor 140 that is responsible for measuring the temperature of the spectroscopic module 160. In this manner, by setting multiple items to be input, the precision of the measurement of the temperature characteristic by the machine learning model can be further improved.

Furthermore, the greater the number of pieces of characteristic data (teacher data) that are accumulated in the storage unit 210, the more the precision of the machine learning model can be improved. In the present embodiment, after the machine learning model is generated, the temperature characteristic of the spectroscopic module 160 is also periodically measured. Thus, the characteristic data is acquired, and the machine learning model is updated. Accordingly, a further improvement in the precision of the estimation of the temperature characteristic is achieved.

Third Embodiment

In the second embodiment described above, the example is described in which the spectroscopic apparatus 100 manufactured in a factory is set to be a target, the temperature characteristic is derived by the temperature characteristic derivation apparatus 200, and the derived temperature characteristic is stored in the memory 155.

In contrast, a third embodiment is different from the second embodiment in that the temperature characteristic which is stored in the memory 155 of the spectroscopic apparatus 100 that is already shipped from a factory is updated.

Figure 13:
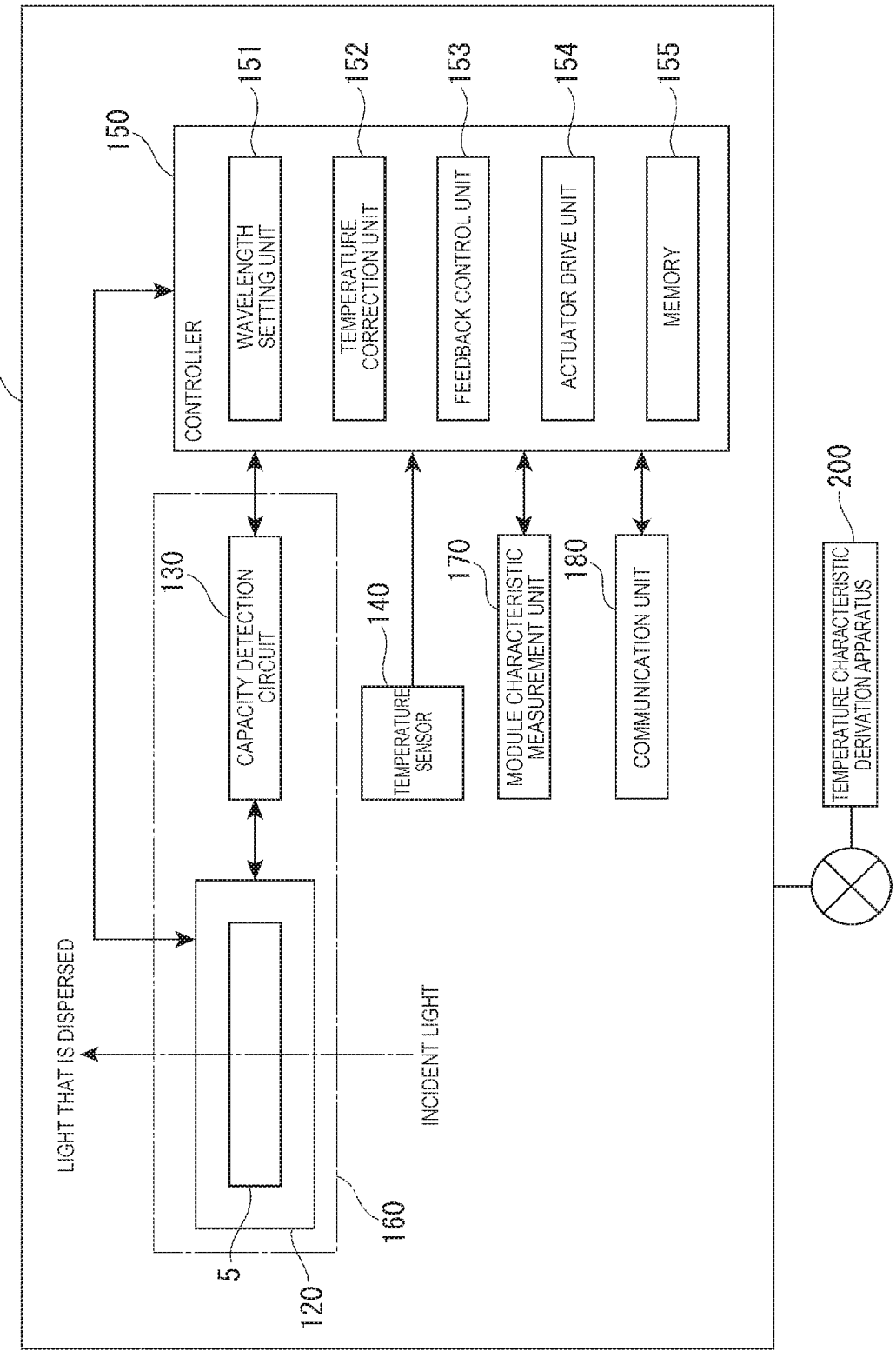
FIG. 13 is a diagram illustrating a schematic configuration of a spectroscopic system according to a third embodiment.

FIG. 13 is a diagram illustrating a schematic configuration of a spectroscopic system 400 according to the present embodiment.

The spectroscopic system 400 according to the third embodiment is communicably connected to a spectroscopic apparatus 100A and the temperature characteristic derivation apparatus 200 through a network.

Furthermore, the spectroscopic apparatus 100A according to the present embodiment, as illustrated in FIG. 4, further includes a mobile characteristic measurement unit 170, which measures the module characteristic of the spectroscopic module 160, and a communication unit 180, in addition to the configuration according to the first embodiment.

In the present embodiment, the mobile characteristic measurement unit 170 measures the optical characteristic of the wavelength variable interference filter 5.

For example, a configuration is set to be employed in which a light source unit that illuminates the wavelength variable interference filter 5 with a reference light that has a uniform amount of light for each wavelength, and a light receiving unit that receives a light which passes through the wavelength variable interference filter 5 are provided. In this case, the mobile characteristic measurement unit 170 causes the dimension of the gap G of the wavelength variable interference filter 5 to be changed, causes a light component with multiple wavelengths to sequentially pass through from the reference light, and measures an amount of light with each wavelength, which is received in the light receiving unit. Thus, a transmittance for each wavelength can be measured.

Furthermore, the spectroscopic apparatus 100A may be built into a spectrometer that has the light source unit and the light receiving unit and that illuminates a measurement target with the reference light, disperses a reflection light in the spectroscopic apparatus 100A, and measures a light that results from the light spectral-dispersion. In this case, the light source unit and the light receiving unit that are used for measurement of light spectral-dispersion by the spectrometer can be used for the measurement of the optical characteristic of the spectroscopic module 160.

Furthermore, the mobile characteristic measurement unit 170 may measure the drive characteristic of the wavelength variable interference filter 5. For example, the mobile characteristic measurement unit 170 applies a given drive voltage to the electrostatic actuator 56, and measures the drive characteristic of the wavelength variable interference filter 5 based on the detection signal that is output from the capacity detection circuit 130. In this case, a specific oscillation frequency can be detected from a variable period of the detection signal. Furthermore, the detection signal can measure the stabilization time based on the time that it takes for the detection signal to reach a constant value. Moreover, the responsiveness can be measured with the time that it takes for the detection signal at a given signal value to be output after a voltage is applied.

Then, the communication unit 180 transmits the module characteristic that is measured in the mobile characteristic measurement unit 170, to temperature characteristic derivation apparatus 200 through a network, and receives the temperature characteristic that is derived in the temperature characteristic derivation apparatus 200. Accordingly, the temperature characteristic that is stored in the memory 155 can be updated.

Furthermore, in the temperature characteristic derivation apparatus 200 according to the present embodiment, the target module characteristic acquisition unit 223 receives the module characteristic that is transmitted from the spectroscopic apparatus 100, as the target module characteristic, through a network. Then, the temperature characteristic acquisition unit 224 inputs the received target module characteristic into the machine learning model, and replies to the spectroscopic apparatus 100, which is a source of the transmission, with the temperature characteristic that is output.

Operation and Effect According to the Present Embodiment

The spectroscopic system 400 according to the present embodiment includes the spectroscopic apparatus 100A and the temperature characteristic derivation apparatus 200 that is communicably connected to the spectroscopic apparatus 100A through a network. Then, the spectroscopic apparatus 100A includes the mobile characteristic measurement unit 170 that measures the module characteristic of the spectroscopic module 160, and the communication unit 180 that transmits the measured module characteristic to the temperature characteristic derivation apparatus 200 and receives the temperature characteristic that is transmitted from the temperature characteristic derivation apparatus 200. Furthermore, the target module characteristic acquisition unit 223 of the temperature characteristic derivation apparatus 200 acquires the module characteristic that is transmitted from the spectroscopic apparatus 100A, as the target module characteristic. Then, the temperature characteristic acquisition unit 224 inputs the target module characteristic that is transmitted from the spectroscopic apparatus 100A, into the machine learning model, and transmits the temperature characteristic that is output, to the spectroscopic apparatus 100A.

In the spectroscopic system 400, in the spectroscopic apparatus 100A, even in a case where the module characteristic of the spectroscopic module 160 changes over years, the temperature characteristic that corresponds to the changed module characteristic can be easily acquired from the temperature characteristic derivation apparatus 200. Accordingly, the precision of the light spectral-dispersion by the spectroscopic apparatus 100A can be maintained with high precision over a long period of time.

MODIFICATION EXAMPLE

First Modification Example

In the first modification, the example is described in which the temperature coefficient that corresponds to the temperature of the spectroscopic module 160 is included as the temperature characteristic, but no limitation to this is imposed.

For example, the center wavelength of the light that passes through the wavelength variable interference filter 5, for the temperature of the spectroscopic module 160, may be recorded as the temperature characteristic. Alternatively, the center wavelength of the light passing through the wavelength variable interference filter 5 in a case where the spectroscopic module 160 is a reference temperature is set to be a reference center length, and a difference of the center wavelength of the light that passes through the wavelength variable interference filter 5, for the temperature of the spectroscopic module 160, from a reference center wavelength, may be recorded as the temperature characteristic.

Alternatively, the gap dimension for the temperature of the spectroscopic module 160 may be recorded as the temperature characteristic. Alternatively, the gap dimension in a case where the spectroscopic module 160 is the reference temperature is set to be a reference gap dimension, and a difference of the gap dimension for the temperature of the spectroscopic module 160, from the reference gap dimension, may be recorded as the temperature characteristic.

In these cases, an amount of change (or an amount of change in the gap dimension) in the center wavelength per unit temperature can be calculated as the temperature coefficient.

Second Modification Example

In the first embodiment, the low temperature-side temperature coefficient $C_{t1}$ and the high temperature-side temperature coefficient $C_{t2}$, which are derived based on the temperature characteristic that corresponds to three temperatures, that is, the reference temperature, the first temperature, and the second temperature, are described as examples. However, no limitation to this is imposed. For example, the spectroscopic module 160 may be caused to change among four or more temperatures, and at each temperature, a transmission wavelength of the wavelength variable interference filter 5, which results when the voltage that is to be applied to the electrostatic actuator 56 is caused to change, may be measured.

In this case, in the same manner as in the example that is illustrated in FIG. 6, the horizontal axis and the vertical axis are set to represent a temperature, a light spectral-dispersion center wavelength, respectively, each measurement point is plotted, a slope (an amount of wavelength shift versus to an amount of unit temperature change) of a line that connects measurement points is calculated, and thus the calculated slope can be set to be the temperature coefficient.

Furthermore, for example, a polynomial approximate equation, which is of the second or higher degree, may be derived from each measurement point. In this case, a slope at the detection temperature T can be calculated and the calculated slope can be set to be a temperature coefficient. Moreover, a differential form of the polynomial approximate equation may be further derived, and in this case, if the detection temperature T of the temperature sensor 140 is input to the differential equation, the temperature coefficient at the detection temperature T can be obtained.

Third Modification Example

In the first embodiment, Equation (2) is described as an example of the correction value calculation function, but no limitation to this is imposed.

Figure 14:
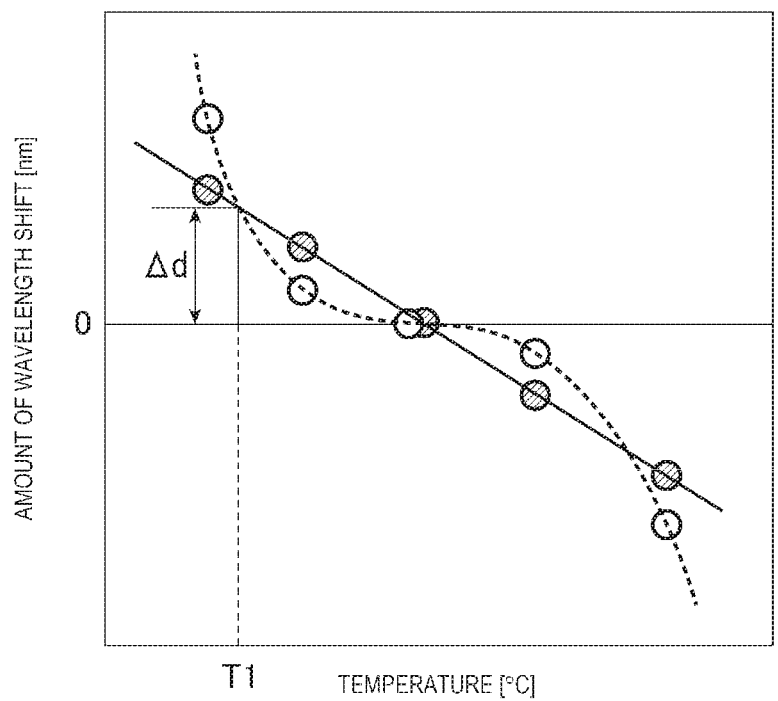
FIG. 14 is a diagram illustrating another method of calculating an amount of correction.

FIG. 14 is a diagram illustrating another method of calculating an amount of correction.

In the present example, as described in the first modification example, a difference of the light spectral-dispersion center wavelength from the reference center wavelength at each temperature is recorded as the temperature characteristic. In this case, the temperature correction unit 152 calculates the difference of the light spectral-dispersion center wavelength that corresponds to the detection temperature T from the reference center wavelength, as an amount of correction gap, from the temperature characteristic.

On this occasion, an approximation function (a temperature characteristic function) that is indicated by a solid line or a broken line in FIG. 14 may be recorded as the temperature characteristic. For example, the solid line in FIG. 14 is an example in which the temperature characteristic changes linearly, and a temperature characteristic function, which is a first-degree equation, is recorded as the temperature characteristic. In this case, with $a_1$ and $b_1$ being fixed numbers, an amount $\Delta d$ of correction gap at the detection temperature T can be calculated by $\Delta d = a_1 \times T + b_1$ (however, in a case where the reference temperature is set to be $T_{ini}$, $b_1 = -a_1 \times T_{ini}$).

Furthermore, an example that is indicated by the broken line in FIG. 14 is a temperature characteristic function that approximates a non-linearly changing temperature characteristic with a polynomial equation that is of the second or higher degree. For example, in a case where the temperature characteristic function is approximated with a third-degree equation, the amount $\Delta d$ of correction gap can be calculated by $\Delta d = a_2 \times T^3 + b_2 \times T^2 + c_2 T + d_2$ (however, in a case where the reference temperature is set to be $T_{ini}$, $a_2 \times T_{ini}^3 + b_2 \times T_{ini}^2 + c_2 T_{ini} + d_2 = 0$).

Furthermore, an amount $\Delta V_t$ of correction that corresponds to the amount $\Delta d$ of correction gap is stored in advance in the memory 155 of the spectroscopic apparatus 100. Accordingly, it is possible that the amount $\Delta V_t$ of correction is obtained from the amount $\Delta d$ of correction gap, and that the correction voltage $V_{tcali}$ is obtained based on Equation (1).

Fourth Modification Example

In the first embodiment, the example is described in which the temperature correction unit 152 inputs the temperature coefficient $C_{temp}$ and the detection temperature T into the correction value calculation function that is expressed in each of Equations (1) and (2), and thus calculates the target voltage $V_{tcali}$ but no limitation to this is imposed.

For example, at each temperature of the spectroscopic module 160, the mount $\Delta V_t$ of correction that is calculated using Equation (2), or the target voltage $V_{tcali}$ that is calculated using Equation (1) may be calculated in advance, and the result of the calculation is stored, as the table data, in the memory 155.

In this case, the temperature correction unit 152 may only read the amount $\Delta V_t$ of correction that corresponds to the detection temperature T or the target voltage $V_{tcali}$, from the table data, and achieves a reduction in processing load.

Fifth Modification Example

In the second embodiment, the example is described in which the temperature characteristic derivation apparatus 200 includes at least the shape characteristic, the optical characteristic, and the drive characteristic of the wavelength variable interference filter 5, as the module characteristic of the spectroscopic module 160, but may include at least one of the shape characteristic, the optical characteristic, and the drive characteristic of the wavelength variable interference filter 5.

As described above, each of the shape characteristic, the optical characteristic, and the drive characteristic of the wavelength variable interference filter 5 has a correlation to the temperature characteristic of the spectroscopic module 160. Because of this, the machine learning model can also be generated from any one of the shape characteristic, the optical characteristic, and the drive characteristic of the wavelength variable interference filter 5 and from the temperature characteristic of the spectroscopic module 160.

Sixth Modification Example

In the first embodiment, the example is described in which the wavelength variable interference filter 5 (the optical device 120), the capacity detection circuit 130, and the temperature sensor 140 are arranged on the same circuit substrate 101, but no limitation to this is imposed.

For example, a configuration may be employed in which, in the spectroscopic module that accommodates the wavelength variable interference filter 5 and the capacity detection circuit 130 within the casing of which the internal space is sealed, the wavelength variable interference filter 5 and the capacity detection circuit 130 are positioned on different substrates, respectively. Alternatively, the wavelength variable interference filter 5 and the capacity detection circuit 130 may be arranged at a distance apart. In this case, the temperature sensor 140 is positioned in a given position within the sealed space. Within the sealed space, there is a correlative relationship among a temperature in a temperature detection position, the temperature of the wavelength variable interference filter 5, and the temperature of the capacity detection circuit 130. Consequently, by using the temperature characteristic of the spectroscopic module 160 for the temperature that is detected by the temperature sensor 140, in the same manner as in the first embodiment, a target value (a target voltage) suitable for shift-moving the wavelength variable interference filter 5 can be set based on the temperature characteristic and the detection temperature.

Other Modification Examples

The electrostatic actuator 56 is described, for example, as the gap changing unit of the wavelength variable interference filter 5, but no limitation to this is imposed. For example, a piezoelectric actuator, such as a piezo element, between the first substrate 51 and the second substrate 52, may be positioned, and the dimension of the gap G may be changed by applying a voltage to the piezoelectric actuator.

The spectroscopic apparatuses 100 and 100A that are described in the first and second embodiments and the third embodiment, respectively can find application in various optical apparatuses. For example, if the spectroscopic apparatuses 100 and 100A find application in the spectrometer as described in the third embodiment, a light spectral-dispersion measurement that is a target for measurement can be made. The spectrometer can further be built into a printer, a projector, or the like, and it is possible that a color measurement of an image that is printed in the printer, or an image that is projected in the projector is made.

Furthermore, in addition, the spectroscopic apparatus 100 can find application in light source apparatuses or the like that outputs a light with a given wavelength.

In addition, a specific structure that is available when the invention is implemented may have a configuration that results from suitably combining the embodiments and modification examples, which are described above, in a range where the object of the invention can be achieved, or suitable changing of the specific structure to other structures or other like may be performed.

The entire disclosure of Japanese Patent Application No. 2018-032152 filed on Feb. 26, 2018 is expressly incorporated by reference herein.

What is claimed is:
1. A spectroscopic apparatus comprising:
a spectroscopic module;
a temperature detector that detects a temperature of the spectroscopic module; and
a module controller that controls the spectroscopic module,
wherein the spectroscopic module includes
an interference filter that has a pair of reflection films and an actuator which changes a dimension of a gap between the pair of reflection films by application of a voltage, and
a capacity detection circuit that outputs a detection signal in accordance with an electrostatic capacity between the pair of reflection films, and
wherein the module controller corrects a target value of the detection signal that is output from the capacity detection circuit, based on a temperature characteristic of the spectroscopic module and a detection temperature that is detected by the temperature detector, and controls the voltage that is to be applied to the actuator, in such a manner that the detection signal that is output from the capacity detection circuit is the corrected target value.

2. The spectroscopic apparatus according to claim 1, wherein the temperature characteristic of the spectroscopic module includes a correction coefficient for the temperature of the spectroscopic module, and
wherein the module controller inputs the correction coefficient that corresponds to the detection temperature and the detection temperature into a correction value calculation function that includes the correction coefficient and the temperature, and corrects the target value.

3. The spectroscopic apparatus according to claim 2, wherein the correction coefficient is derived based on an actual measurement value of a center wavelength of a light passing through the interference filter, which results when the spectroscopic module is caused to change among multiple temperatures and the gap dimension at each temperature is caused to change.

4. The spectroscopic apparatus according to claim 3,
wherein the correction coefficients include a low temperature-side correction coefficient that is derived based on an actual measurement value of the center wavelength at a given reference temperature, and an actual measurement value of the center wavelength at a first temperature that is lower than the reference temperature, and a high temperature-side correction coefficient that is derived based on the actual measurement value of the center wavelength at the reference temperature and on an actual measurement value of the center wavelength at a second temperature that is higher than the reference temperature.

5. The spectroscopic apparatus according to claim 2,
wherein, in order to cause a light with a target wavelength to pass through the interference filter at a given reference temperature, the module controller sets a reference voltage value, which is applied to the actuator, to $V_{tini}$, a gain of the output signal of the capacity detector to Acv, a dielectric constant between the pair of reflection films to ε, an area of the reflection film to $S_m$, the given reference temperature to $T_{ini}$, the gap dimension at the reference temperature $T_{ini}$ to $G_{mTini}$, the correction coefficient to $C_{temp}$, and the detection temperature to T, and calculates a correction voltage $V_{tcali}$ that is the target value, using the correction value calculation function that is expressed in following Equations (1) and (2)

$$V_{tcali} = V_{tini} - \Delta V_t \quad (1)$$

$$\Delta V_t = -A_{CV}\frac{\varepsilon S_m}{G_{mTini}^2}C_{temp}(T - T_{ini}). \quad (2)$$

6. The spectroscopic apparatus according to claim 1,
wherein the temperature characteristic is derived from inputting the module characteristic of the spectroscopic module into a machine learning model of which an input is set to be a module characteristic that is a characteristic of the spectroscopic module, and of which an output is set to be the temperature characteristic.

7. The spectroscopic apparatus according to claim 6,
wherein the module characteristic includes an optical characteristic of the interference filter.

8. The spectroscopic apparatus according to claim 7,
wherein the optical characteristic includes a transmittance for each wavelength, which results when a light with each wavelength is caused to pass through the interference filter.

9. The spectroscopic apparatus according to claim 6,
wherein the module characteristic includes a shape characteristic of the interference filter.

10. The spectroscopic apparatus according to claim 6,
wherein the module characteristic includes a drive characteristic of the interference filter, which results when a voltage is applied to the actuator.

11. The spectroscopic apparatus according to claim 1,
wherein the interference filter, the capacity detection circuit, and the temperature detector are provided on the same substrate.

12. A temperature characteristic derivation apparatus that derives a temperature characteristic of spectroscopic module which includes an interference filter that has a pair of reflection films and an actuator which changes a dimension of a gap between the pair of reflection films by application of a voltage, and a capacity detection circuit that detects an electrostatic capacity between the pair of reflection films, the apparatus comprising:

a data accumulation unit that stores characteristic data which results from associating a module characteristic of each of multiple spectroscopic modules and an actual measurement value of the temperature characteristic, in a storage unit for accumulation;

a model generator that generates a machine learning model of which an input is set to be the module characteristic and of which an output is set to be the temperature characteristic, from the characteristic data;

a target module characteristic acquisition unit that acquires the module characteristic of the spectroscopic module which is a target for deriving a temperature characteristic, as a target module characteristic; and a temperature characteristic acquisition unit that inputs the target module characteristic into the machine learning model and thus obtains the temperature characteristic.

13. The temperature characteristic derivation apparatus according to claim 12,
wherein the module characteristic includes an optical characteristic of the interference filter.

14. The temperature characteristic derivation apparatus according to claim 13,
wherein the optical characteristic includes a transmittance for each wavelength, which results when a light with each wavelength is caused to pass through the interference filter.

15. The temperature characteristic derivation apparatus according to claim 12,
wherein the module characteristic includes a shape characteristic of the interference filter.

16. The temperature characteristic derivation apparatus according to claim 12,
wherein the module characteristic includes a drive characteristic of the interference filter, which results when a voltage is applied to the actuator.

17. A spectroscopic system in which a spectroscopic apparatus according to claim 1, and a temperature characteristic derivation apparatus are communicatively connected to each other,
wherein the temperature characteristic derivation apparatus derives a temperature characteristic of spectroscopic module which includes an interference filter that has a pair of reflection films and an actuator which changes a dimension of a gap between the pair of reflection films by application of a voltage, and a capacity detection circuit that detects an electrostatic capacity between the pair of reflection films, and the temperature characteristic derivation apparatus includes:

a data accumulation unit that stores characteristic data which results from associating a module characteristic of each of multiple spectroscopic modules and an actual measurement value of the temperature characteristic, in a storage unit for accumulation;

a model generator that generates a machine learning model of which an input is set to be the module characteristic and of which an output is set to be the temperature characteristic, from the characteristic data;

a target module characteristic acquisition unit that acquires the module characteristic of the spectroscopic module which is a target for deriving a temperature characteristic, as a target module characteristic; and a temperature characteristic acquisition unit that inputs the target module characteristic into the machine learning model and thus obtains the temperature characteristic, wherein the spectroscopic apparatus includes a module characteristic measurement unit that measures a module characteristic at a given reference temperature of the spectroscopic module, and a communication unit that transmits the module characteristic to the temperature characteristic derivation apparatus and receives the temperature characteristic that is transmitted from the temperature characteristic derivation apparatus, wherein the target module characteristic acquisition unit acquires the module characteristic that is transmitted from the spectroscopic apparatus, as the target module characteristic, and wherein the temperature characteristic acquisition unit transmits the temperature characteristic that is output from the machine learning model, to the spectroscopic apparatus.

18. A spectroscopic system in which a spectroscopic apparatus according to claim 2, and a temperature characteristic derivation apparatus are communicatively connected to each other, wherein the temperature characteristic derivation apparatus derives a temperature characteristic of spectroscopic module which includes an interference filter that has a pair of reflection films and an actuator which changes a dimension of a gap between the pair of reflection films by application of a voltage, and a capacity detection circuit that detects an electrostatic capacity between the pair of reflection films, and the temperature characteristic derivation apparatus includes:

a data accumulation unit that stores characteristic data which results from associating a module characteristic of each of multiple spectroscopic modules and an actual measurement value of the temperature characteristic, in a storage unit for accumulation;

a model generator that generates a machine learning model of which an input is set to be the module characteristic and of which an output is set to be the temperature characteristic, from the characteristic data;

a target module characteristic acquisition unit that acquires the module characteristic of the spectroscopic module which is a target for deriving a temperature characteristic, as a target module characteristic; and a temperature characteristic acquisition unit that inputs the target module characteristic into the machine learning model and thus obtains the temperature characteristic, wherein the spectroscopic apparatus includes a module characteristic measurement unit that measures a module characteristic at a given reference temperature of the spectroscopic module, and a communication unit that transmits the module characteristic to the temperature characteristic derivation apparatus and receives the temperature characteristic that is transmitted from the temperature characteristic derivation apparatus, wherein the target module characteristic acquisition unit acquires the module characteristic that is transmitted from the spectroscopic apparatus, as the target module characteristic, and wherein the temperature characteristic acquisition unit transmits the temperature characteristic that is output from the machine learning model, to the spectroscopic apparatus.

19. A spectroscopy method in a spectroscopic apparatus that includes a spectroscopic module and a temperature detector that detects a temperature of the spectroscopic module, with the spectroscopic module including an interference filter that has a pair of reflection films and an actuator which changes a dimension of a gap between the pair of reflection films by application of a voltage, and a capacity detection circuit that detects an electrostatic capacity between the pair of reflection films, the method comprising:

detecting the temperature of the spectroscopic module using the temperature detector;

correcting a target value of a detection signal that is output from the capacity detection circuit, based on a temperature characteristic of the spectroscopic module and on a detection temperature that is detected by the temperature detector; and controlling the voltage that is to be applied to the actuator in such a manner that the detection signal that is output from the capacity detection circuit is the corrected target value.

20. A temperature characteristic derivation method in which a temperature characteristic of a spectroscopic module, which includes an interference filter that has a pair of reflection films and an actuator which changes a dimension of a gap between the pair of reflection films by application of a voltage, and a capacity detection circuit that detects an electrostatic capacity between the pair of reflection films, is derived using a computer, the computer performs:

reading characteristic data from an accumulation unit in which pieces of characteristic data each of which results from associating a module characteristic and an actual measurement value of the temperature characteristic at a given reference temperature in the multiple spectroscopic modules, are accumulated, and generating a machine learning model of which an input is set to be the module characteristic and of which an output is set to be the temperature characteristic;

acquiring the module characteristic of the spectroscopic module that is a target for deriving a temperature characteristic, as a target module characteristic; and inputting the target module characteristic into the machine learning model and acquiring the temperature characteristic that is output from the machine learning model.

* * * * *